(12) United States Patent
Peng et al.

(10) Patent No.: US 10,878,161 B2
(45) Date of Patent: Dec. 29, 2020

(54) METHOD AND STRUCTURE TO REDUCE CELL WIDTH IN INTEGRATED CIRCUITS

(71) Applicant: TAIWAN SEMICONDUCTOR MANUFACTURING COMPANY, LTD., Hsinchu (TW)

(72) Inventors: Shih-Wei Peng, Hsinchu (TW); Chih-Ming Lai, Hsinchu (TW); Jiann-Tyng Tzeng, Hsinchu (TW); Wei-Cheng Lin, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/532,339

(22) Filed: Aug. 5, 2019

(65) Prior Publication Data
US 2020/0104445 A1 Apr. 2, 2020

Related U.S. Application Data

(60) Provisional application No. 62/739,069, filed on Sep. 28, 2018.

(51) Int. Cl.
*G06F 30/392* (2020.01)
*G06F 30/398* (2020.01)
*G03F 1/36* (2012.01)

(52) U.S. Cl.
CPC .......... *G06F 30/392* (2020.01); *G06F 30/398* (2020.01); *G03F 1/36* (2013.01)

(58) Field of Classification Search
USPC ........................................................ 716/119
See application file for complete search history.

(56) References Cited

U.S. PATENT DOCUMENTS

| 7,260,442 | B2 | 8/2007 | Hwang et al. |
| 9,256,709 | B2 | 2/2016 | Yu et al. |
| 2011/0080542 | A1* | 4/2011 | Huang ............... G02F 1/136209 349/106 |
| 2011/0108904 | A1* | 5/2011 | Wang ................. H01L 29/40114 257/316 |
| 2014/0040838 | A1 | 2/2014 | Liu et al. |
| 2015/0278429 | A1 | 10/2015 | Chang |
| 2020/0104445 | A1* | 4/2020 | Peng ..................... G06F 30/398 |

* cited by examiner

*Primary Examiner* — Mohammed Alam
(74) *Attorney, Agent, or Firm* — Hauptman Ham, LLP

(57) ABSTRACT

An integrated circuit includes an active zone extending in a first direction, and a spacer extending in a second direction perpendicular to the first direction. The spacer protrudes into a substrate and divides the active zone into a first part and a second part. The integrated circuit includes a first conductive segment and a second conductive segment each extending in the second direction and in a middle layer between the substrate and a metal layer. The first conductive segment forms conductive contact with an active region of a first transistor in the first part of the active zone, and the second conductive segment forms conductive contact with an active region of the second transistor in the second part of the active zone. The spacer joins the first conductive segment and the second conductive segment while electrically isolating the first conductive segment from the second conductive segment.

20 Claims, 29 Drawing Sheets q-q' p-p'

METHOD AND STRUCTURE TO REDUCE CELL WIDTH IN INTEGRATED CIRCUITS

PRIORITY CLAIM

The present application claims the priority of U.S. Provisional Application No. 62/739,069, filed Sep. 28, 2018, which is incorporated herein by reference in its entirety.

BACKGROUND

The recent trend in miniaturizing integrated circuits (ICs) has resulted in smaller devices which consume less power yet provide more functionality at higher speeds. The miniaturization process has also resulted in more strict restriction on the layout design of the IC circuits. During the layout design of the IC circuits, functional or physical cells are often placed in a circuit layout and routed to form functional circuits. The size reduction of these cells often increases the circuit density of the IC circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4Ex-4Ey are schematic diagrams of the conductive connection between a conductive segment and a power rail in the first metal layer, in accordance with some embodiments.

FIGS. 5Dx-5Dy are schematic diagrams of the conductive connection between a conductive segment and a power rail in the second metal layer, in accordance with some embodiments.

DETAILED DESCRIPTION

Figure 1:
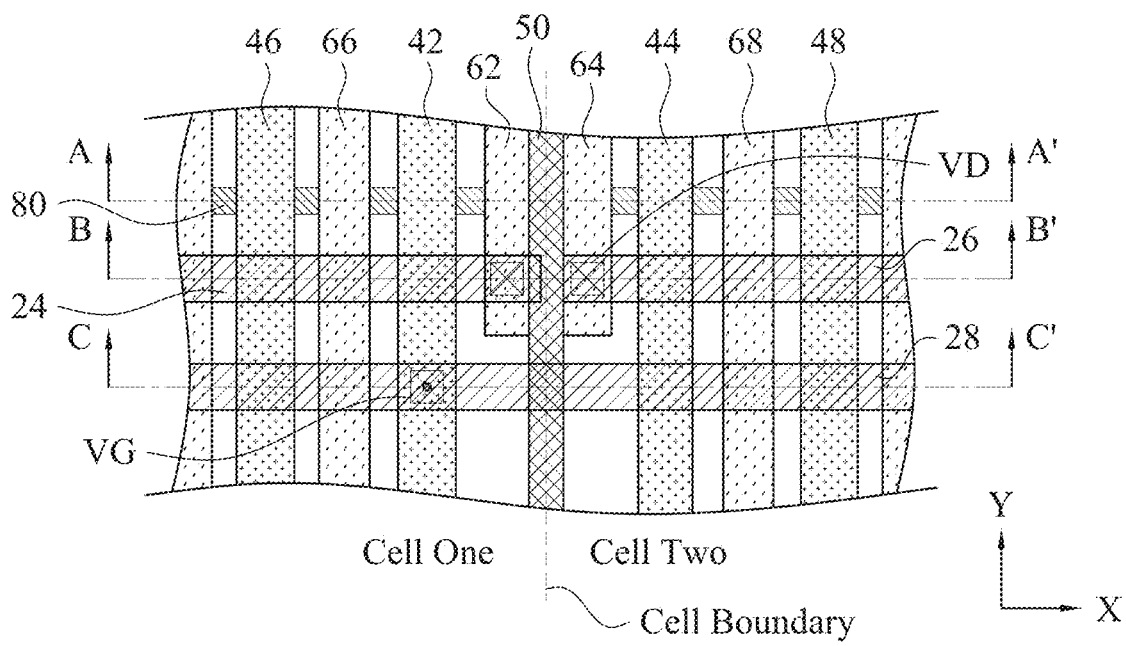
FIG. 1 is a schematic diagram of a section of a layout design for an IC circuit, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2A:
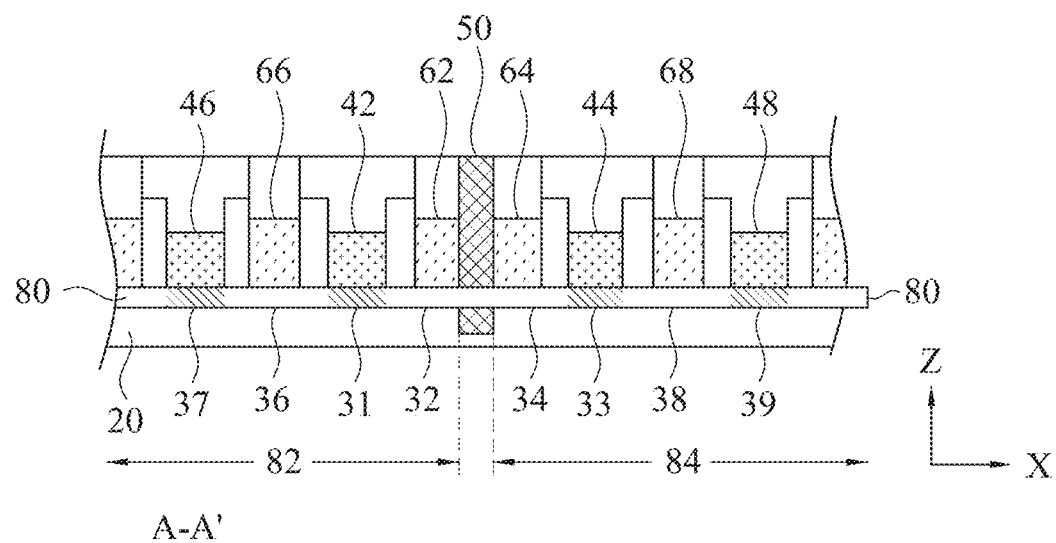
FIGS. 2A-2C are cross-sectional views of some parts of the IC circuit in FIG. 1, in accordance with some embodiments.
Figure 2B:
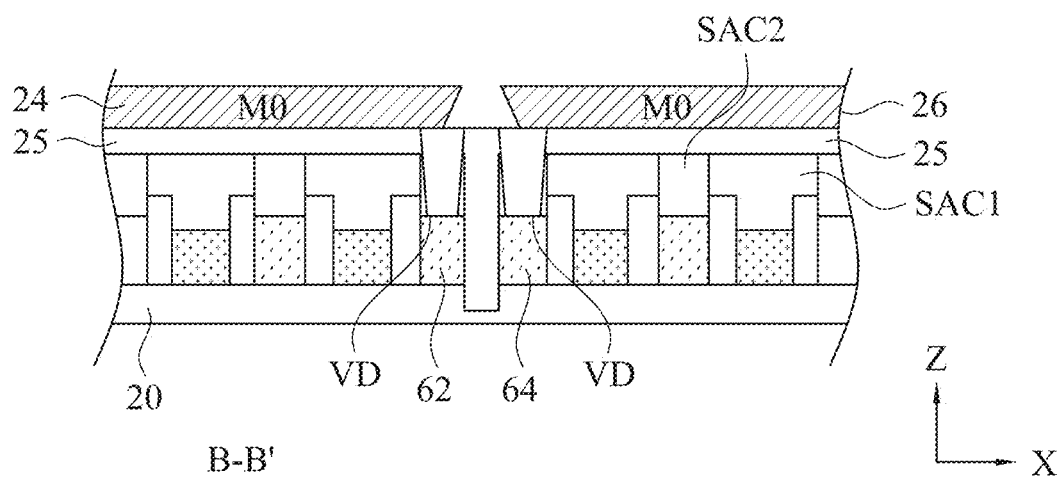
Figure 2C:
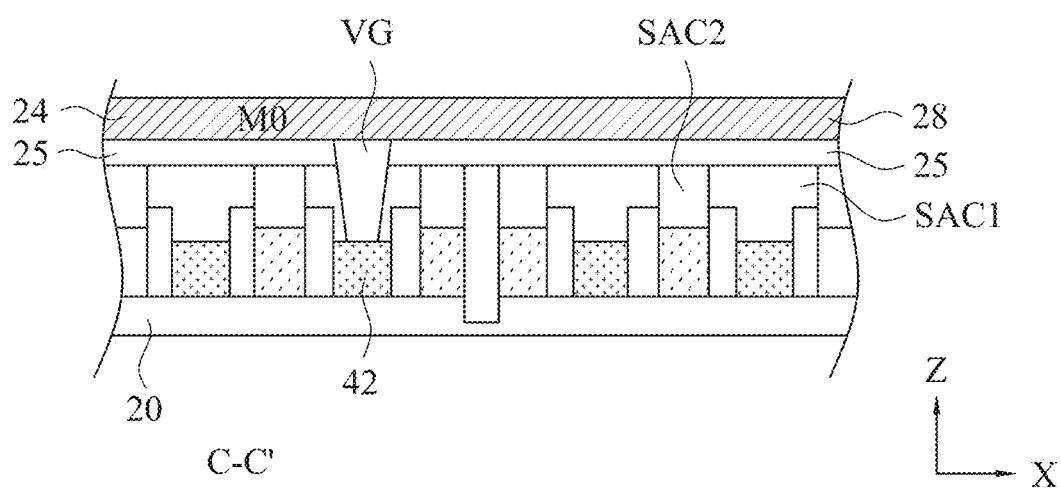

FIG. 1 is a schematic diagram of a section of a layout design for an IC circuit, in accordance with some embodiments. FIGS. 2A-2C are cross-sectional views of some parts of the IC circuit in FIG. 1, in accordance with some embodiments. The integrated circuit as specified by the layout design in FIG. 1 includes an active zone 80 extending in the X-direction, a spacer 50 extending in the Y-direction, gate-strips (e.g., 42, 44, 46, and 48) extending in the Y-direction, conductive segments (e.g., 62, 64, 66, and 68) extending in the Y-direction, and metal lines (e.g., 24, 26, and 28) extending in the X-direction.

In some embodiments, the boundary of the active zone 80 is logically specified by an oxide dimensioning pattern during the layout process, while the active zone 80 is fabricated using one or more masks in a process that involves oxidation, etching, diffusion, and other steps. In FIGS. 2A-2C, the active zone 80 in a semiconductor substrate 20 includes the active regions (e.g., 32, 34, 36, and 38) for fabricating the source/drain terminals of Field Effect Transistors (FETs). In some embodiments, the active regions are formed with a masked diffusing process. When a conductive segment (e.g., 62, 64, 66, or 68) crosses over and forms conductive contact with one of the active regions (e.g., 32, 34, 36, and 38), the conductive segment becomes a conductive line connecting to the source or the drain of a FET. The channel regions (e.g., 31, 33, 37, and 39) in FETs are formed underneath the gate-strips (e.g., 42, 44, 46, and 48) as these gate-strips cross over the active zone 80. In some embodiments, fin structures in the X-direction are fabricated in the active zone 80, and the gates for Fin-FETs are formed above the channel regions with the gate-strips crossing over the fin structures. In some embodiments, the gates for other type of FETSs are formed above the channel regions when the gate-strips cross over the active zone 80.

FIG. 2A is a cross-sectional view of the IC circuit in FIG. 1 along cutting plane A-A'. As shown in FIG. 1 and FIG. 2A, the spacer 50 protrudes into the semiconductor substrate 20 and divides the active zone 80 into a first part 82 and a second part 84. The first part 82 and the second part 84 of the active zone 80 are conductively isolated from each other by the spacer 50. In some embodiments, before the spacer 50 is fabricated to protrude into the semiconductor substrate 20, the active zone 80 is fabricated in the form of a continuous oxide diffusion (CNOD) zone which does not break at the boundary between two abutting cells for constructing a functional circuit. The spacer 50 that breaks the active zone 80 is fabricated from insulating materials. In some embodiments, the spacer 50 is fabricated from silicon nitride ($Si_3N_4$). In FIG. 1 and FIG. 2A, the spacer 50 physically joins the conductive segment 62 and the conductive segment 64 while preventing conductive contact between these two conductive segments 62 and 64.

In FIG. 1 and FIG. 2A, a first transistor having the channel region 31 between two active regions (e.g., 32 and 36) is formed in the first part 82 of the active zone 80, and a second transistor having the channel region 33 between two active regions (e.g., 34 and 38) is formed in the second part 84 of the active zone 80. In some embodiments, the spacer 50 is located at a boundary between a first cell and a second cell, and each of the first cell and the second cell includes one or more logic functions. The first transistor having the channel region 31 is located inside the first cell, and the second transistor having the channel region 33 is located inside the second cell. In some embodiments, the first cell includes another transistor having the channel region 37 that is formed in the first part 82 of the active zone 80, and the second cell includes another transistor having the channel region 39 that is formed in the second part 84 of the active zone 80.

Figure 3A:
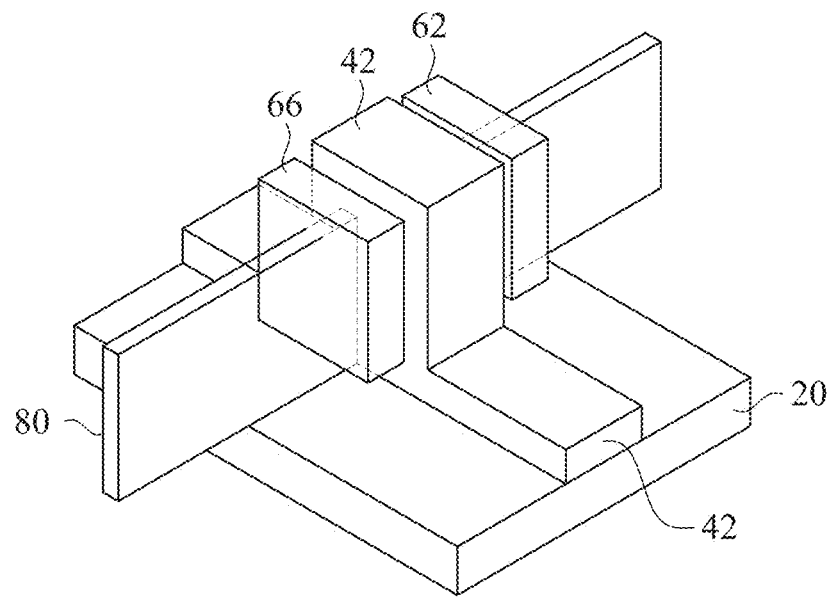
FIGS. 3A-3B are perspective views of the active zone of FIG. 2A having one or more fin structures under the gate-strips and the conductive segments, in accordance with some embodiments.
Figure 3B:
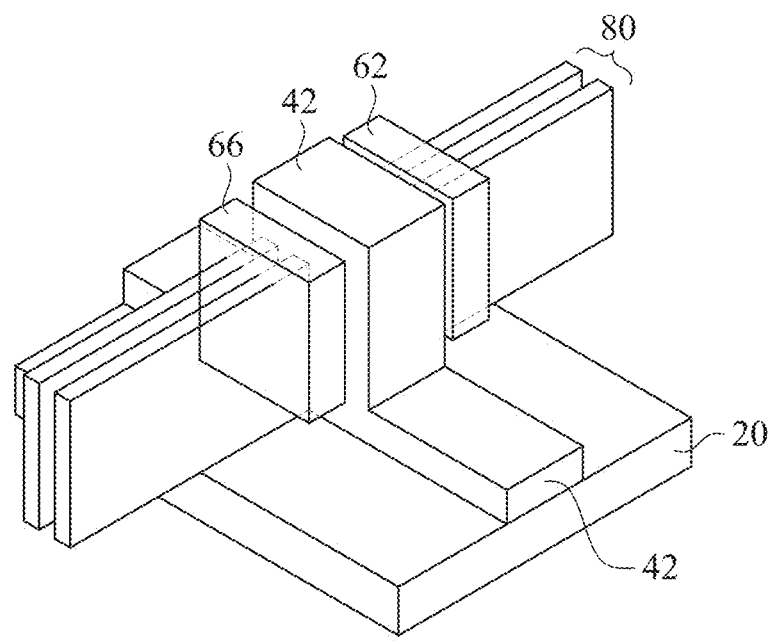

FIGS. 3A-3B are perspective views of the active zone 80 of FIG. 2A having one or more fin structures under the gate-strips (e.g., 42) and the conductive segments (e.g., 62 and 66), in accordance with some embodiments. In FIG. 3A, one fin structure extending in the X-direction is fabricated for the active zone 80, and the gate channel is formed between the gate-strip 42 and the fin structure. In FIG. 3B, two fin structures extending in the X-direction are fabricated for the active zone 80, and the gate channel is formed between the gate-strip 42 and the two fin structures. In FIGS. 3A-3B, each of the two conductive segments (e.g., 62 and 66) conductively contacts one of the active regions (in the active zone 80) on either side of the gate channel under the gate-strip 42, and forms one of the source connection or drain connection of the FinFET which has its gate connected to the gate-strip 42. In some embodiments, gate supporting structures other than the fin structure are fabricated for the active zone 80, and other types of FETs (e.g., Gate-all-around FETs, Omega-gate FET, or Tri-gate FETs) are fabricated on the gate supporting structures in the active zone 80.

FIG. 2B is a cross-sectional view of the IC circuit in FIG. 1 along cutting plane B-B'. FIG. 2C is a cross-sectional view of the IC circuit in FIG. 1 along cutting plane C-C'. In FIGS. 2B-2C, the conductive segments (e.g., 62, 64, 66, and 68) are fabricated in a middle layer, such as a Middle Diffusion Layer (MD layer), between the semiconductor substrate 20 and a metal layer M0. The metal layer M0 overlies an Inter Layer Dielectric layer (e.g., ILD layer 25) on the semiconductor substrate 20. Conductive routing lines (e.g., 24, 26, and 28) are fabricated in the metal layer M0. In FIG. 2B, the conductive routing line 24 is conductively connected to the conductive segment 62 through one of the vias VD, and the conductive routing line 26 is conductively connected to the conductive segment 64 through another one of the vias VD. In FIG. 2C, the conductive routing line 28 is conductively connected to the gate-strip 42 through a via VG.

In some embodiments, as shown in FIG. 2B, a via VD is fabricated on top of a conductive segment, after a portion of the insulation material SAC2 for making self-aligned contacts is selectively removed to make a VD opening that also passes though the ILD layer 25. The conductive filling in the VD opening connects a conductive routing line (e.g., 24) in the metal layer M0 with a corresponding conductive segment (e.g., 62) in the MD layer. In some embodiments, as shown in FIG. 2C, a via VG is fabricated on top of a gate-strip, after a portion of the insulation material SAC1 for making self-aligned contacts is selectively removed to make a VG opening that also passes though the ILD layer 25. The conductive filling in the VG opening connects a conductive routing line (e.g., 28) in the metal layer M0 with a corresponding gate-strip (e.g., 42) crossing the active zone 80.

Figure 4A:
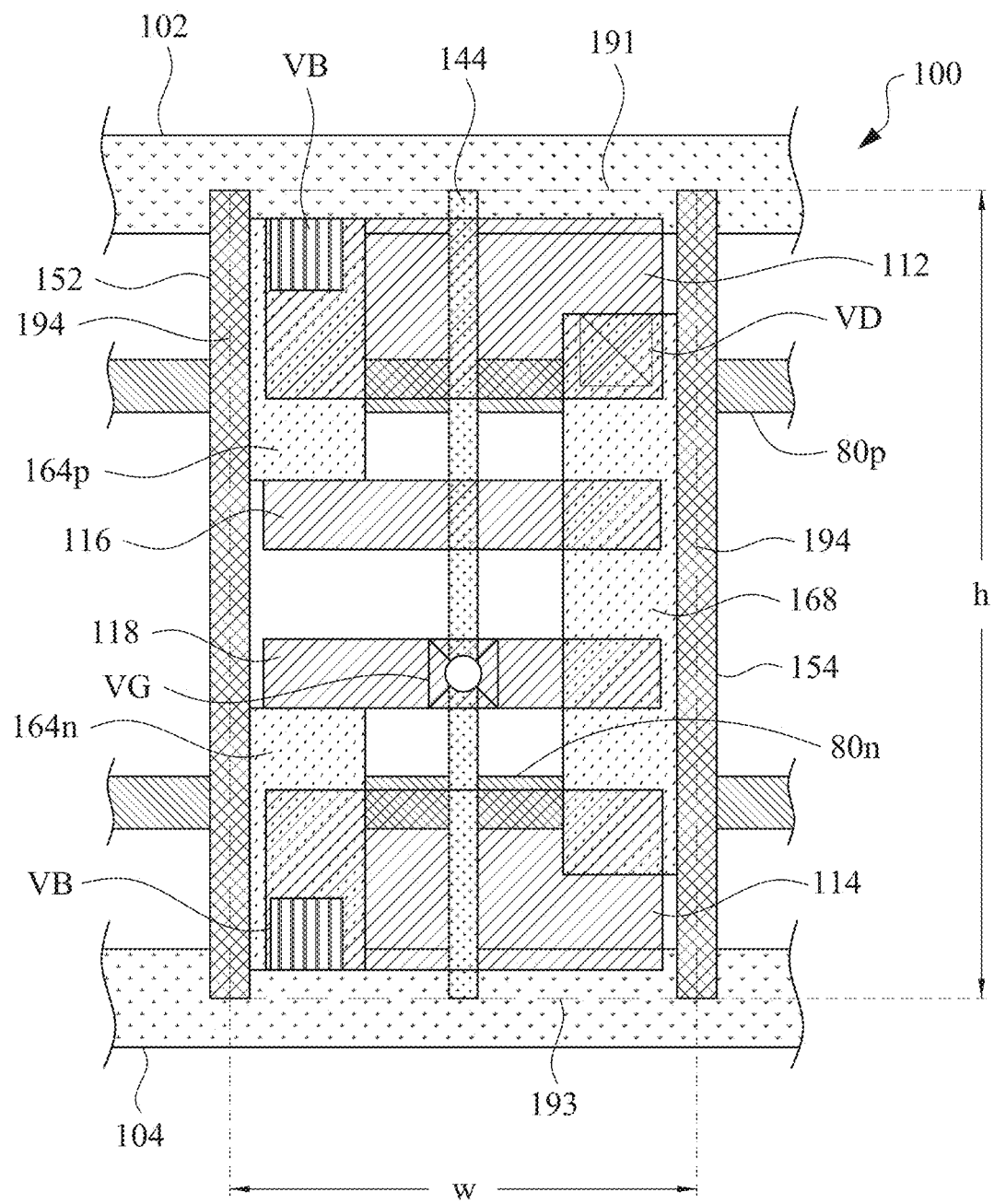
FIG. 4A is a schematic diagram of a layout design of an inverter cell having spacers at vertical cell boundaries, in accordance with some embodiments.
Figure 4B:
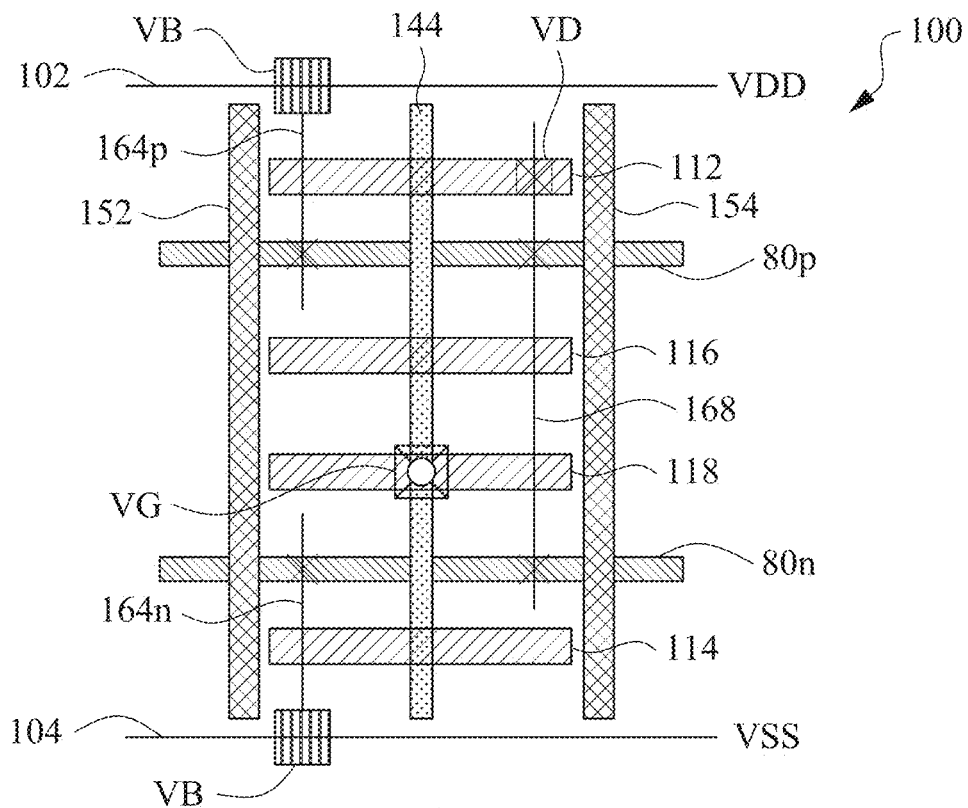
FIG. 4B is a stick diagram of the inverter cell in the layout design of FIG. 4A, in accordance with some embodiments.
Figure 4C:
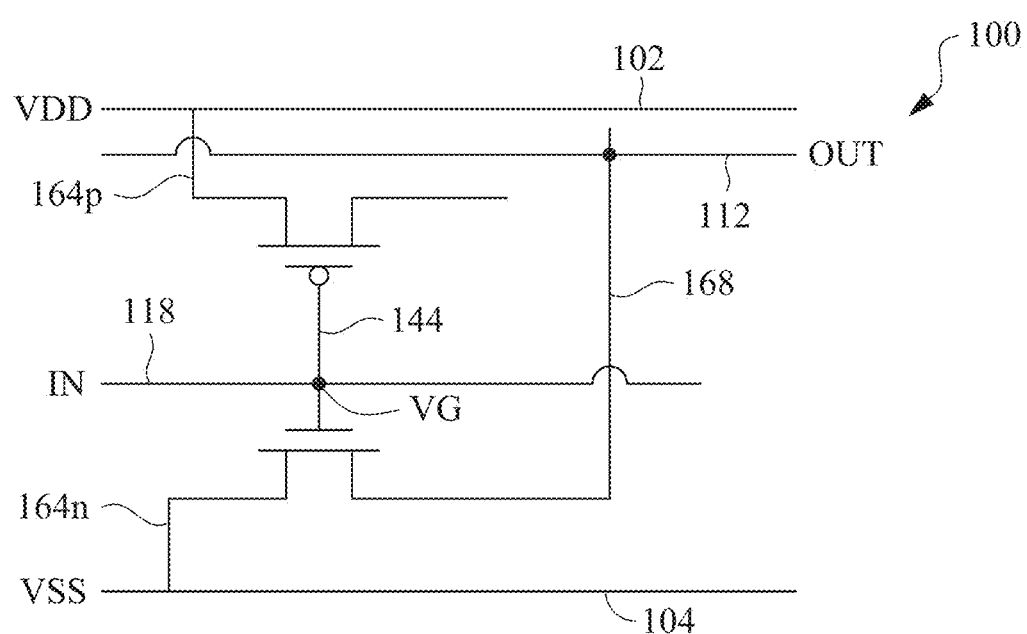
FIG. 4C is a circuit diagram of the inverter in FIG. 4B, in accordance with some embodiments.

FIG. 4A is a schematic diagram of a layout design of an inverter cell 100 having spacers at vertical cell boundaries, in accordance with some embodiments. FIG. 4B is a stick diagram of the inverter cell 100 in the layout design of FIG. 4A. FIG. 4C is a circuit diagram of the inverter in FIG. 4B. In FIG. 4A, the inverter cell 100 is placed between two power rails 102 and 104. The power rails 102 and 104 correspondingly provide the first supply voltage VDD and the second supply voltage VSS to the inverter cell. The power rails 102 and 104 also provide the supply voltages VDD and VSS to some other cells (not shown in the figure) that are placed in the same row as the inverter cell. In some embodiments, the power rails 102 and 104 are buried power rails that are fabricated in a layer that is below the first metal layer for making conductive routing lines. In other embodiments, the power rails 102 and 104 are fabricated in the first metal layer or in another metal layer for making conductive routing lines.

The inverter cell 100 in FIG. 4A has horizontal boundaries (e.g., 191 and 193) and vertical boundaries (e.g., 192 and 194). The horizontal boundaries 191 and 193 are respectively located at the power rails 102 and 104, and separate the inverter cell 100 from the neighboring cells in the rows above or below the row containing the inverter cell. The inverter cell in FIG. 4A has spacers 152 and 154 located at the corresponding vertical boundaries 192 and 194. The vertical boundaries 192 and 194 separate the inverter cell 100 from the neighboring cells that are placed in the same row as the inverter cell. In FIG. 4A, the inverter cell has a height "h" and a width "w".

Various sticks and connections in the stick diagram of the FIG. 4B represent corresponding conductive elements in the layout design of FIG. 4A for making the inverter cell 100. For example, each of the conductive segments (e.g., 164p, 164n, and 168) in FIG. 4A is represented by a corresponding vertical line in FIG. 4B. The gate-strip 144 in FIG. 4A is represented by a vertical stick with the same shading pattern in FIG. 4B. Each of the two active zones (e.g., 80p and 80n) in FIG. 4A is represented by a horizontal stick with the same shading pattern in FIG. 4B. Each of the horizontal routing lines (e.g., 112, 114, 116, and 118) in FIG. 4A is represented by a horizontal stick with the same shading pattern in FIG. 4B. Each of the power rails (e.g., 102 and 104) in FIG. 4A is represented by a horizontal line in FIG. 4B.

In FIG. 4B, each cross-point between a gate-strip (e.g., 144) and an active zone (e.g., 80p and 80n) represents a gate of a transistor. Each cross-point (marked with "x") between a conductive segment (e.g., 164p, 164n, and 168) and an active zone (e.g., 80p and 80n) represents a source/drain of a transistor. For example, the cross-point between the gate-strip 144 and the active zone 80p represents the gate of a p-channel transistor. The cross-point between the conductive segment 164p and the active zone 80p represents the source of the p-channel transistor. The cross-point between the conductive segment 168 and the active zone 80p represents the drain of the p-channel transistor.

In FIG. 4B, the cross connection between the horizontal stick 118 and the gate-strip 144 is a via VG. The cross connection between the horizontal stick 112 and the vertical stick 168 is a via VD. The cross connection between the horizontal line 102 and the vertical stick 164p is a via VB. The cross connection between the horizontal line 104 and the vertical stick 164n is another via VB.

In some embodiments, as shown in FIGS. 4A-4B, the conductive segments (e.g., 164p, 164n, and 168) are fabricated in a MD layer, and the horizontal routing lines (e.g., 112, 114, 116, and 118) are fabricated in a metal layer M0. The MD layer is a conductive layer between the semiconductor substrate and the metal layer M0. In the examples as shown in FIG. 2A-2C, the metal layer M0 overlies an Inter Layer Dielectric layer (e.g., ILD layer 25) on the semiconductor substrate 20. In some embodiments, the horizontal routing line 118 is conductively connected to the gate-strip 144 through a via VG that passes through the insulation between the first metal layer M0 and the gate-strip 144. The horizontal routing line 112 is conductively connected to the conductive segment 168 through a via VD that passes through the insulation between the first metal layer M0 and the MD layer.

Figure 4D:
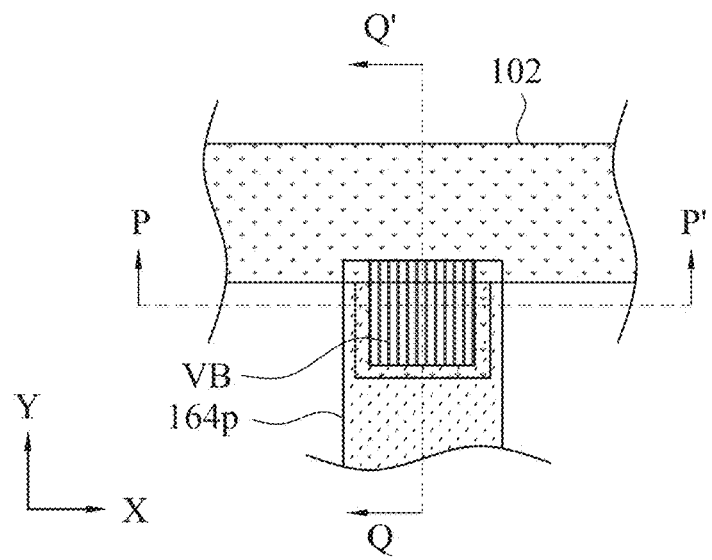
FIG. 4D and FIGS. 4Dx-4Dy are schematic diagrams of the conductive connection between a conductive segment and a power rail, in accordance with some embodiments.
Figure 4D:
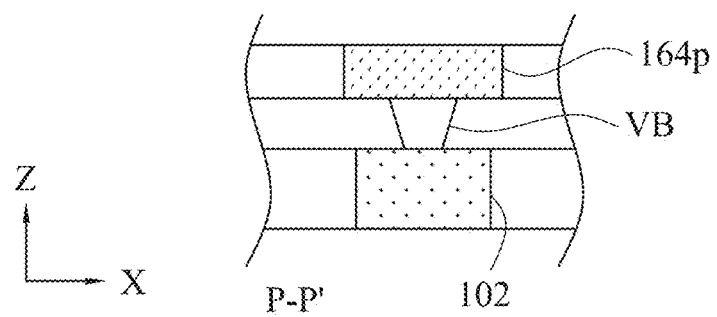
Figure 4D:
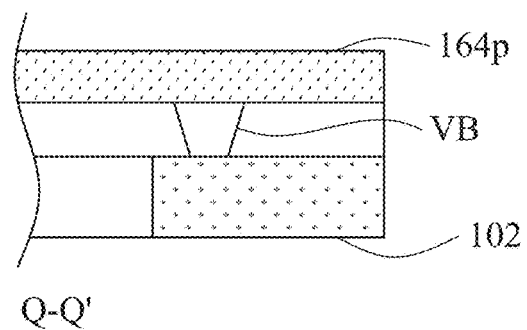

In some embodiments, the power rails 102 and 104 in FIGS. 4A-4B are fabricated in a layer that is below both the MD layer and the first metal layer M0. The conductive segment 164p is conductively connected to the power rail 102 through one of the vias VB, and the conductive segment 164n is conductively connected to the power rail 104 through another one of the vias VB. FIG. 4D and FIGS. 4Dx-4Dy are schematic diagrams of the conductive connection between a conductive segment (e.g., 164p) and a power rail (e.g., 102), in accordance with some embodiments. FIG. 4D is a top view of the conductive connection. FIG. 4Dx is a cross-sectional view of the conductive connection in FIG. 4D along cutting plane P-P'. FIG. 4Dy is a cross-sectional view of the conductive connection in FIG. 4D along cutting plane Q-Q'. As shown in FIG. 4D and FIGS. 4Dx-4Dy, the conductive segment 164p and the power rail 102 are conductively connected through a via VB that passes through the insulation between the MD layer and the conductive layer for the power rail 102.

The inverter in FIGS. 4A-4C has a p-channel transistor formed with the p-type active zone 80p and an n-channel transistor formed with the n-type active zone 80n. The gate of the p-channel transistor is connected to the gate-strip 144 as the gate-strip 144 crosses over the p-type active zone 80p. The gate of the n-channel transistor is connected to the gate-strip 144 as the gate-strip 144 crosses over the n-type active zone 80n. The conductive segment 164p conductively connects the source of the p-channel transistor to the power rail 102, and the conductive segment 164n conductively connects the source of the n-channel transistor to the power rail 104. The conductive segment 168 conductively connects the drain of the p-channel transistor with the drain of the n-channel transistor. The horizontal routing line 118 is conductively connected to the gate-strip 144 and provides the input line for the inverter. The horizontal routing line 112 is conductively connected to the conductive segment 168 and provides the output line for the inverter. In the specific layout design as shown in FIGS. 4A-4B, the horizontal routing lines 114 and 116 are not used for conductively connecting the elements in the inverter.

Figure 5A:
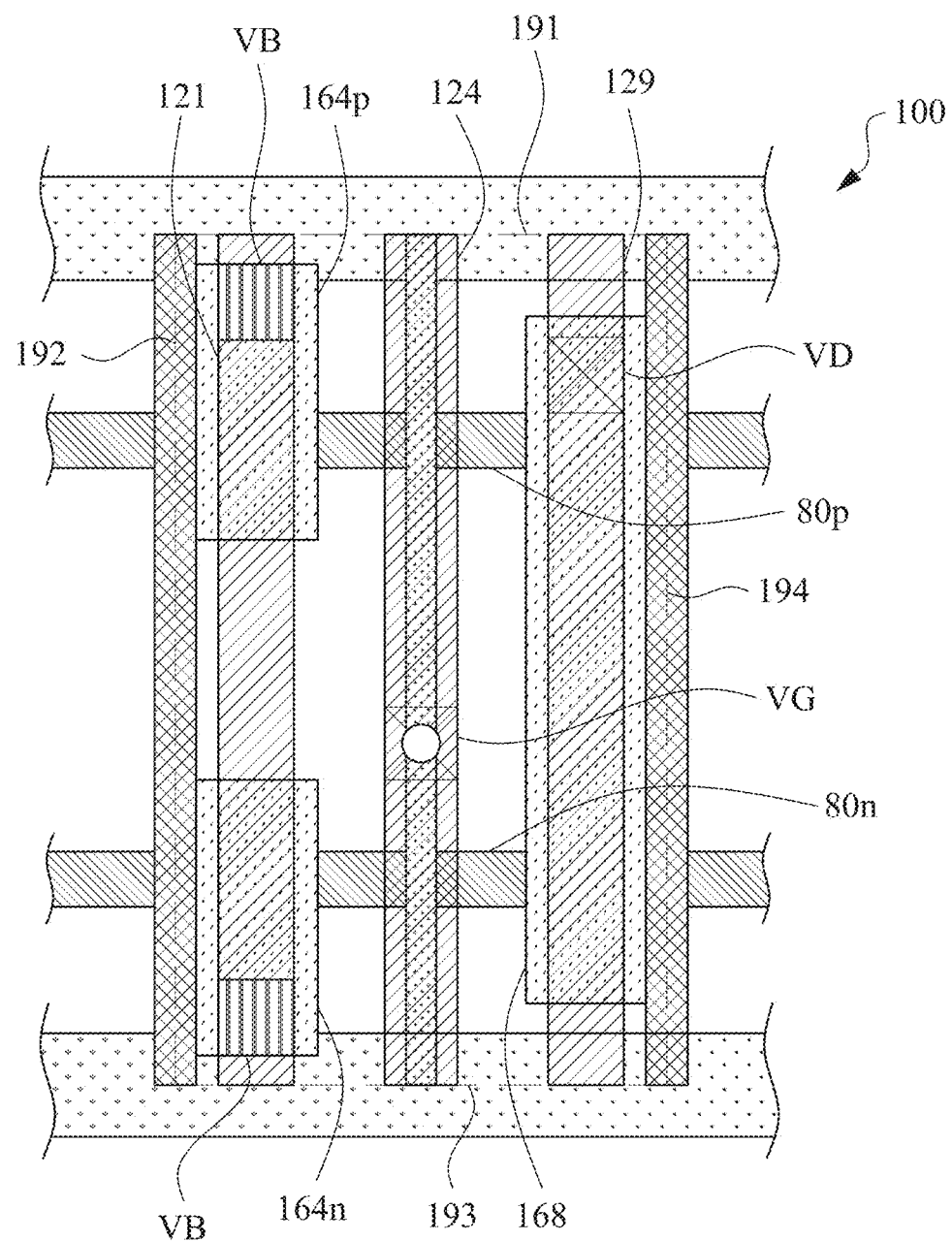
FIG. 5A is a schematic diagram of another layout design of an inverter cell having spacers at vertical cell boundaries, in accordance with some embodiments.
Figure 5B:
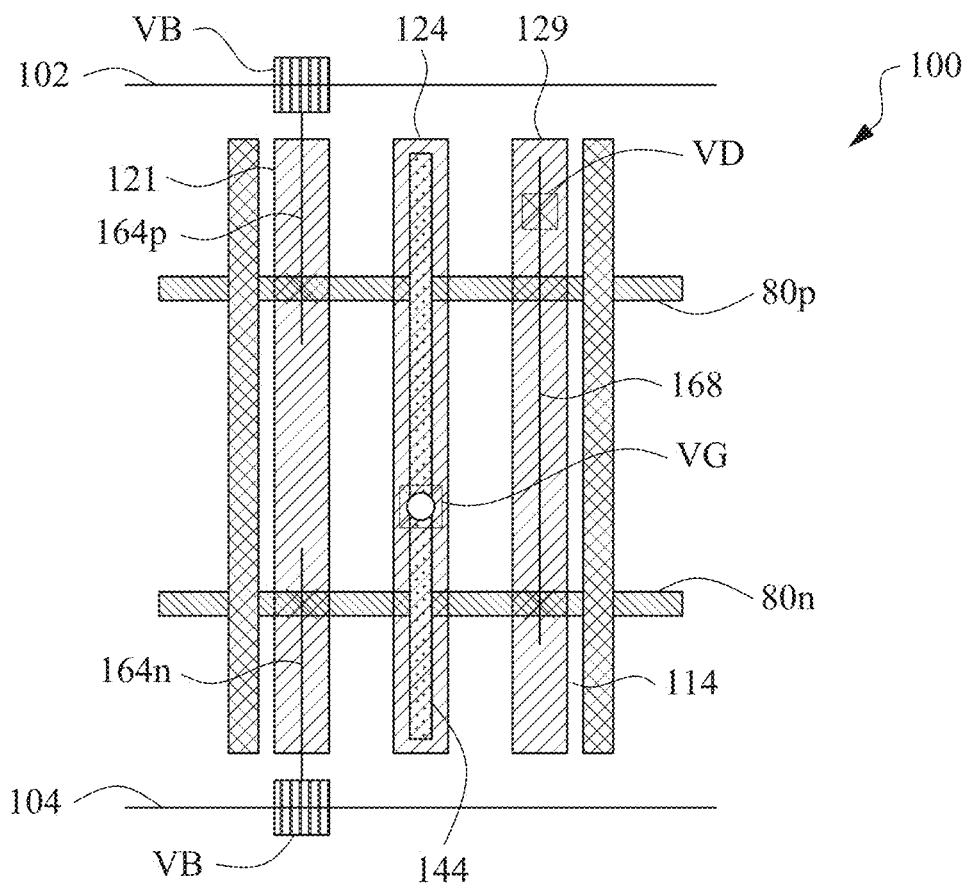
FIG. 5B is a stick diagram of the inverter cell in the layout design of FIG. 5A, in accordance with some embodiments.
Figure 5C:
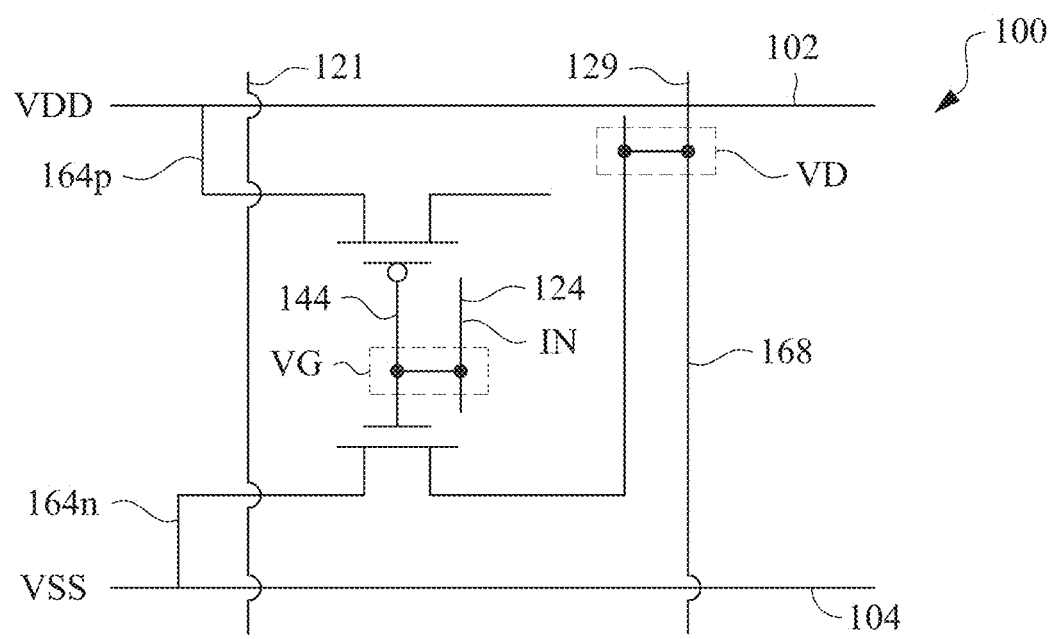
FIG. 5C is a circuit diagram of the inverter in FIG. 5B, in accordance with some embodiments.

FIG. 5A is a schematic diagram of another layout design of an inverter cell 100 having spacers at vertical cell boundaries, in accordance with some embodiments. FIG. 5B is a stick diagram of the inverter cell 100 in the layout design of FIG. 5A. FIG. 5C is a circuit diagram of the inverter in FIG. 5B. The layout designs for the active zones (e.g., 80p and 80p), the gate-strip 144, the conductive segments (e.g., 164p, 164n, and 168), and the spacers (e.g. 152 and 154) are the same in FIG. 4A and FIG. 5A. In FIGS. 4A-4B, the routing lines (e.g., 112 and 118) in the metal layer M0 are orientated horizontally; in FIGS. 5A-5B, the routing lines (e.g., 124 and 129) in the metal layer M0 are orientated vertically. The vertical routing line 124 is conductively connected to the gate-strip 144 through the via VG and provides the input line for the inverter. The vertical routing line 129 is conductively connected to the conductive segment 168 through the via VD and provides the output for the inverter. The vertical routing line 121 is not used for connections in FIG. 5A and FIG. 5B.

Figure 4E:
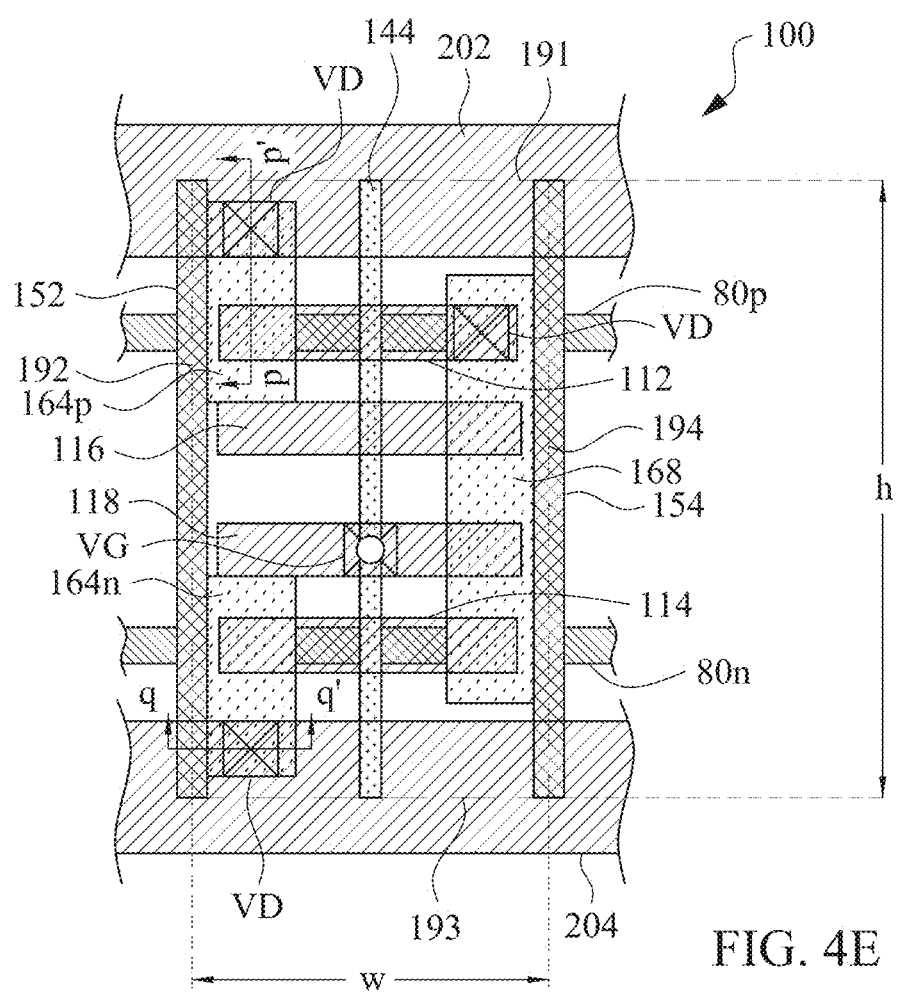
FIG. 4E is a schematic diagram of a layout design of an inverter cell having spacers at vertical cell boundaries and power rails in the first metal layer, in accordance with some embodiments.
Figure 4E:
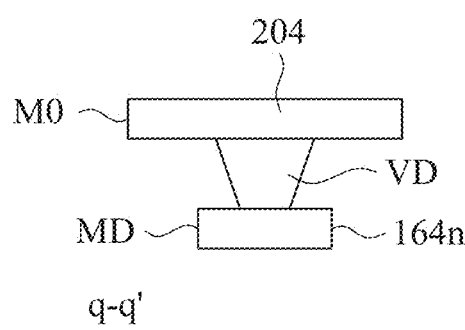
Figure 4E:
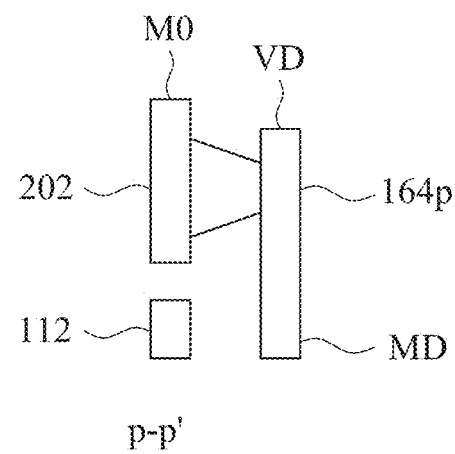

FIG. 4E is a schematic diagram of a layout design of an inverter cell 100 having spacers at vertical cell boundaries and power rails 202 and 204 in the first metal layer M0, in accordance with some embodiments. In FIG. 4E, power rails 202 and 204 in the first metal layer M0 are used as the substitution for the buried power rails 102 and 104 in FIGS. 4A-4B. The conductive segment 164p is conductively connected to the power rail 202 in the first metal layer M0, and the conductive segment 164n is conductively connected to the power rail 204 in the first metal layer M0.

FIGS. 4Ex-4Ey are schematic diagrams of the conductive connection between a conductive segment (e.g., 164p or 164n) and a power rail (e.g., 202 or 204), in accordance with some embodiments. FIG. 4Ex is a cross-sectional view of the conductive connection in FIG. 4D along cutting plane q-q'. FIG. 4Ey is a cross-sectional view of the conductive connection in FIG. 4E along cutting plane p-p'. As shown in FIG. 4E and FIGS. 4Ex, the conductive segment 164n is conductively connected to the power rail 204 through the via VD that passes through the insulation between the MD layer and the first metal layer M0. As shown in FIG. 4E and FIGS. 4Ey, the conductive segment 164p is conductively connected to the power rail 202 through the via VD that passes through the insulation between the MD layer and the first metal layer M0.

Figure 5D:
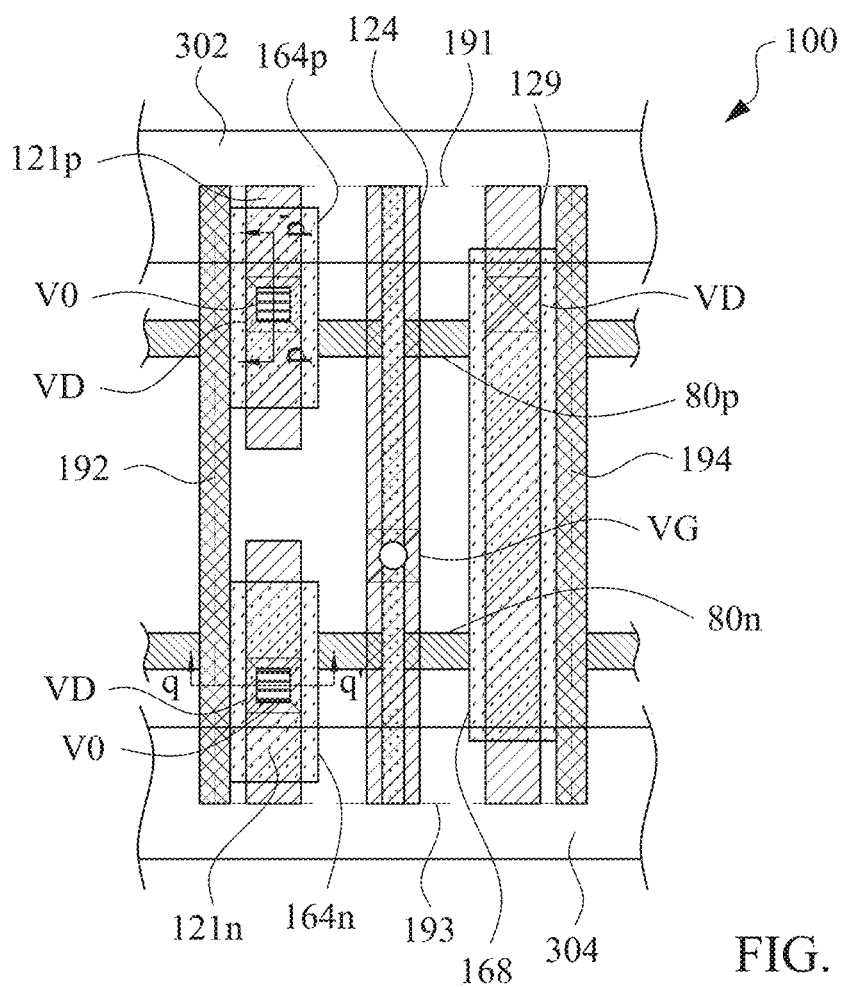
FIG. 5D is a schematic diagram of a layout design of an inverter cell having spacers at vertical cell boundaries and power rails in the second metal layer, in accordance with some embodiments.
Figure 5D:
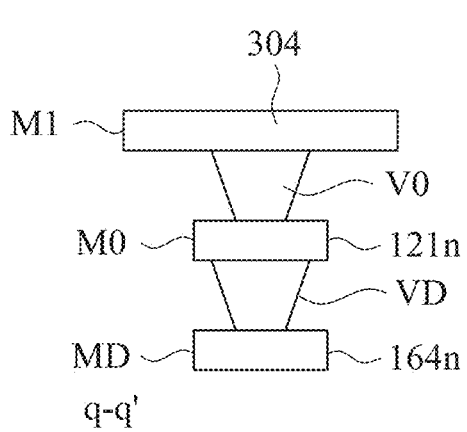
Figure 5D:
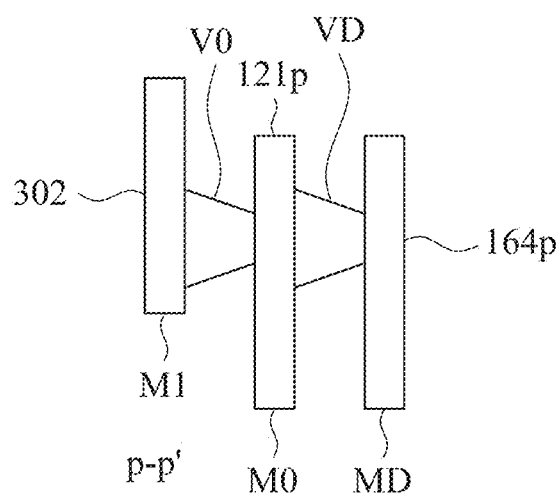

FIG. 5D is a schematic diagram of another layout design of an inverter cell 100 having spacers at vertical cell boundaries and power rails 302 and 304 in the second metal layer M1, in accordance with some embodiments. In FIG. 5D, power rails 302 and 304 in the second metal layer M1 are used as the substitution for the buried power rails 102 and 104 in FIGS. 4A-4B. The conductive segment 164p is conductively connected to the power rail 302 in the second metal layer M1, and the conductive segment 164n is conductively connected to the power rail 304 in the second metal layer M1.

FIGS. 5Dx-5Dy are schematic diagrams of the conductive connection between a conductive segment (e.g., 164p or 164n) and a power rail (e.g., 302 or 304), in accordance with some embodiments. FIG. 5Dx is a cross-sectional view of the conductive connection in FIG. 5D along cutting plane q-q'. FIG. 5Dy is a cross-sectional view of the conductive connection in FIG. 5D along cutting plane p-p'. As shown in FIG. 5D and FIGS. 5Dx, the conductive segment 164n is conductively connected to the vertical routing line 121n through the via VD that passes through the insulation between the MD layer and the first metal layer M0, while the vertical routing line 121n is conductively connected to the power rail 304 through the via VO that passes through the insulation between the first metal layer M0 and the second metal layer M1. As shown in FIG. 5D and FIGS. 5Dy, the conductive segment 164p is conductively connected to the vertical routing line 121p through the via VD that passes through the insulation between the MD layer and the first metal layer M0, while the vertical routing line 121p is conductively connected to the power rail 302 through the via VO that passes through the insulation between the first metal layer M0 and the second metal layer M1.

Figure 6A:
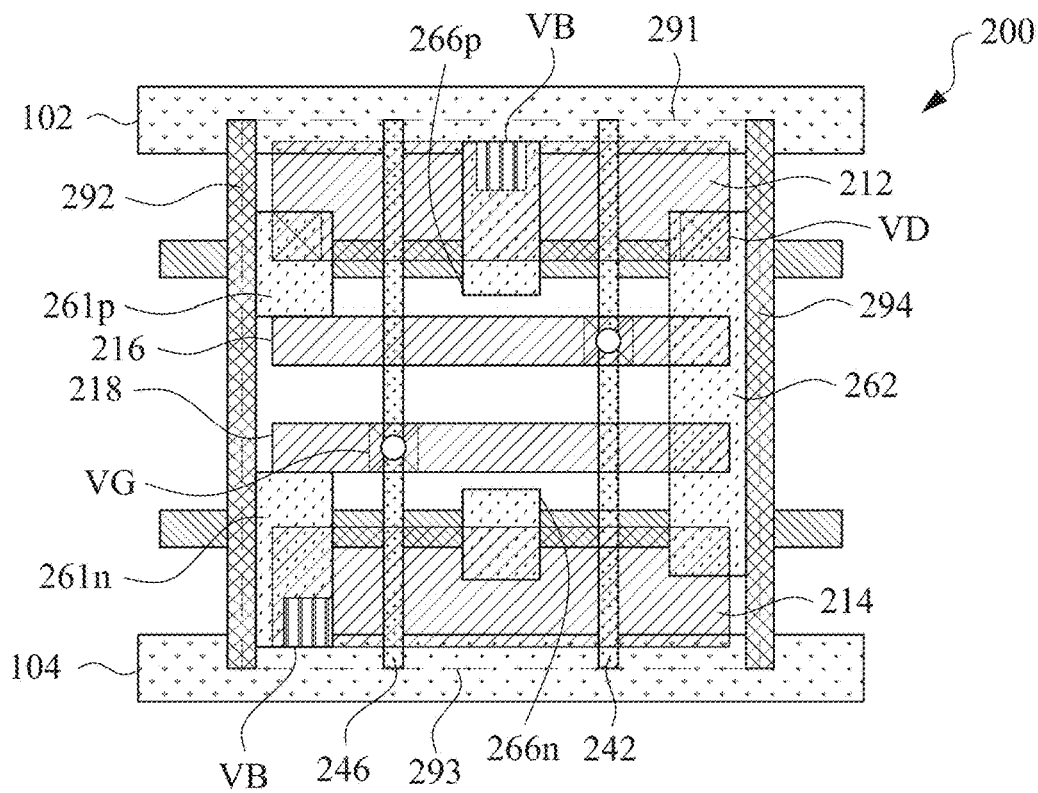
FIG. 6A is a schematic diagram of a layout design of a NAND gate cell having spacers at vertical cell boundaries, in accordance with some embodiments.
Figure 6B:
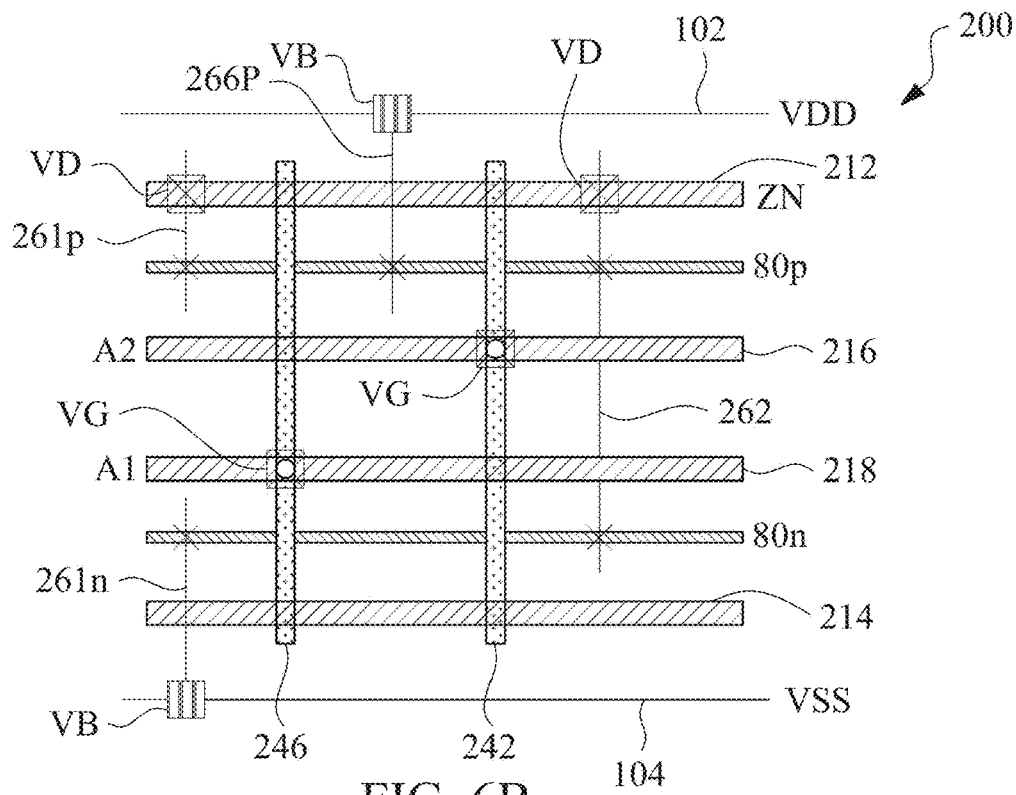
FIG. 6B is a stick diagram of the NAND gate cell in the layout design of FIG. 6A, in accordance with some embodiments.
Figure 6C:
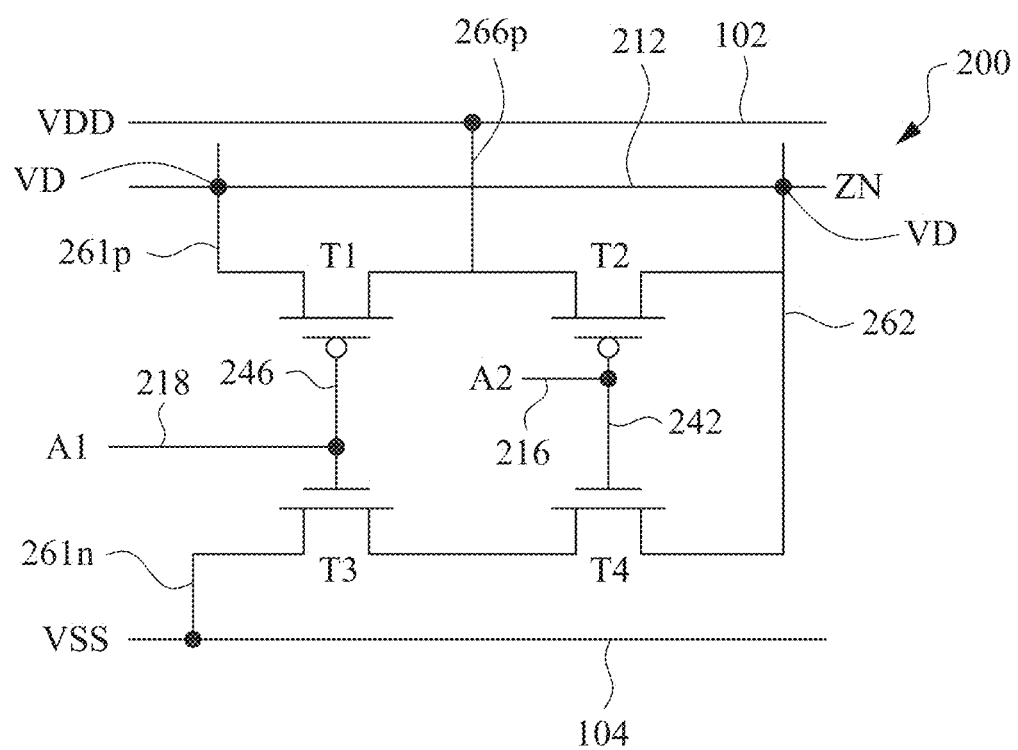
FIG. 6C is a circuit diagram of the NAND gate in FIG. 6B, in accordance with some embodiments.
Figure 7A:
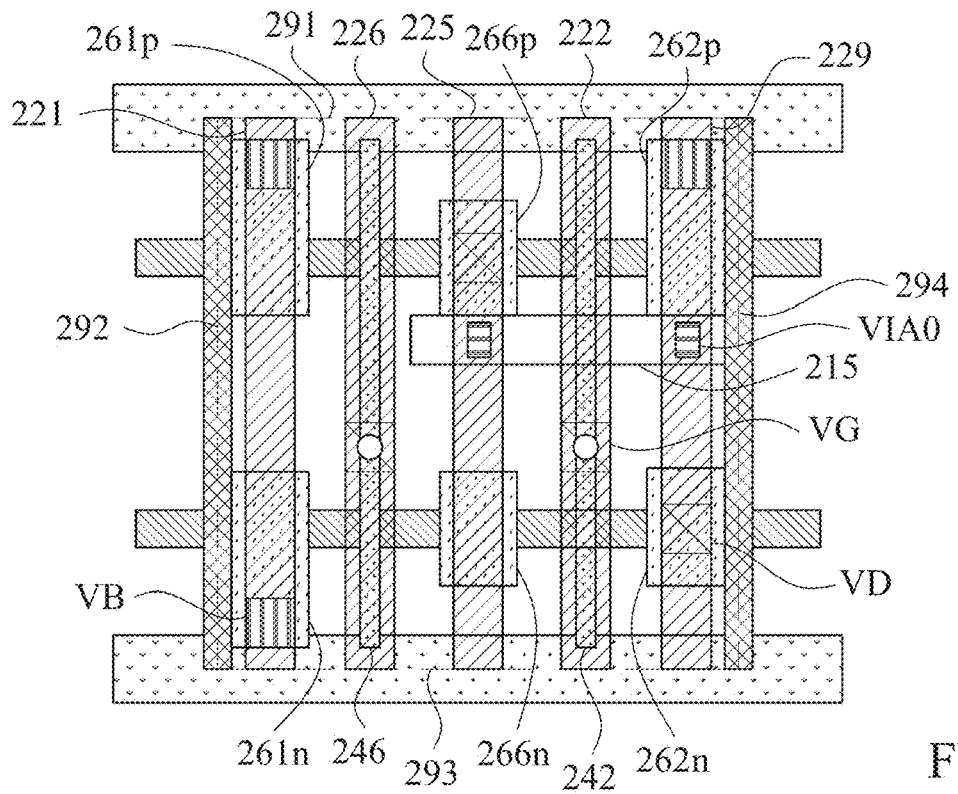
FIG. 7A is a schematic diagram of another layout design of a NAND gate cell having spacers at vertical cell boundaries, in accordance with some embodiments.
Figure 7B:
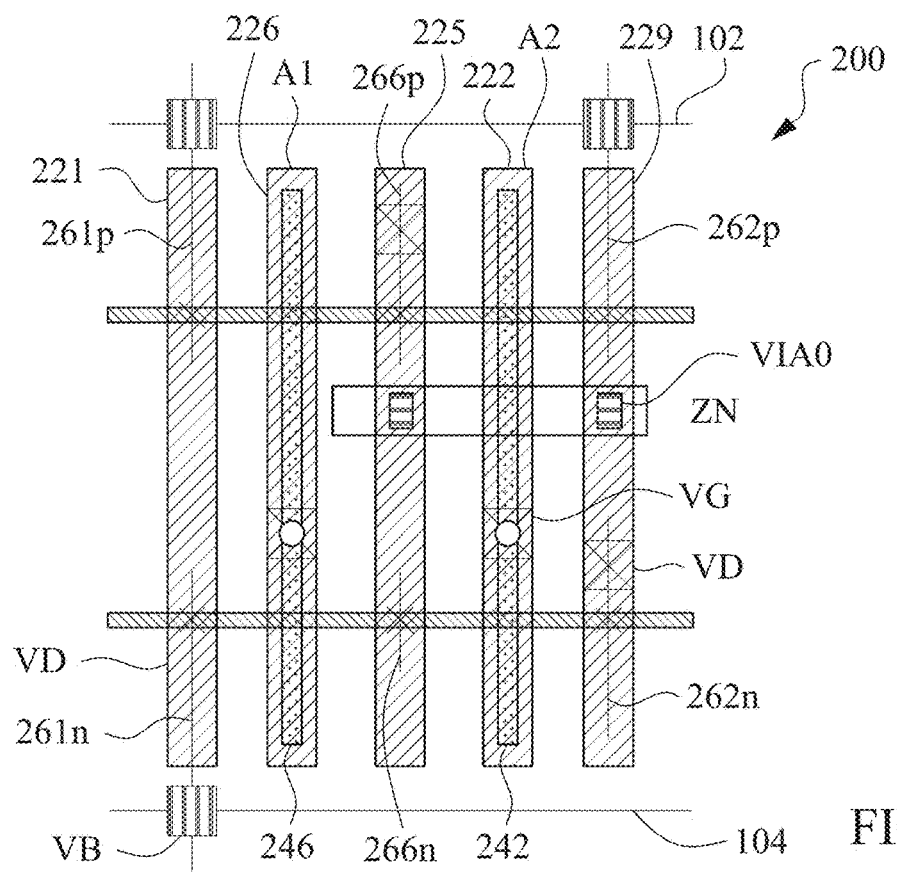
FIG. 7B is a stick diagram of the NAND gate cell in the layout design of FIG. 7A, in accordance with some embodiments.
Figure 7C:
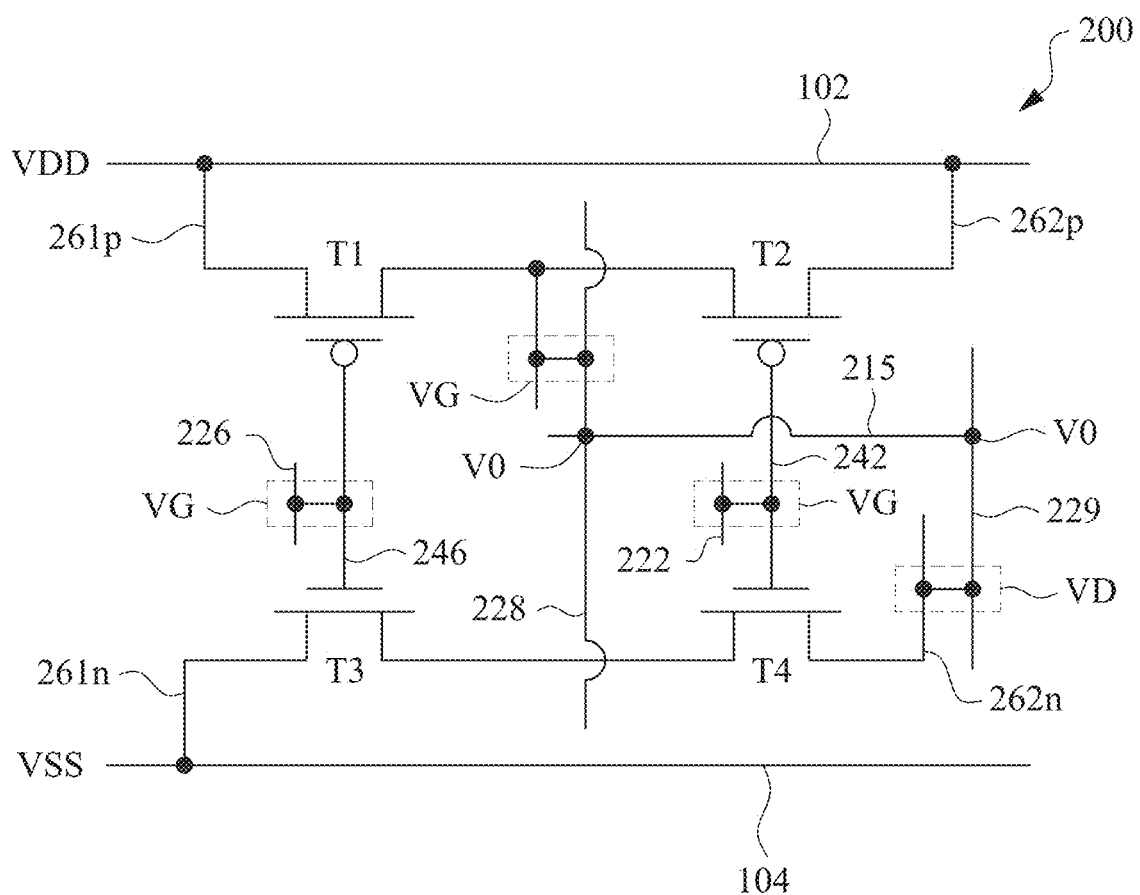
FIG. 7C is a circuit diagram of the NAND gate in FIG. 7B, in accordance with some embodiments.

FIG. 6A is a schematic diagram of a layout design of a NAND gate cell 200 having spacers at vertical cell boundaries, in accordance with some embodiments. FIG. 6B is a stick diagram of the NAND gate cell 200 in the layout design of FIG. 6A. FIG. 6C is a circuit diagram of the NAND gate in FIG. 6B. FIG. 7A is a schematic diagram of another layout design of a NAND gate cell 200 having spacers at vertical cell boundaries, in accordance with some embodiments. FIG. 7B is a stick diagram of the NAND gate cell 200 in the layout design of FIG. 7A. FIG. 7C is a circuit diagram of the NAND gate in FIG. 7B. In FIG. 6A and FIG. 7A, the NAND gate cell is placed between two power rails 102 and 104. The power rails 102 and 104 correspondingly provide the first supply voltage VDD and the second supply voltage VSS to the NAND gate cell. The NAND gate cell 200 in FIG. 6A and FIG. 7A has horizontal boundaries (e.g., 291 and 293) and vertical boundaries (e.g., 292 and 294).

Various sticks and connections in the stick diagram (e.g., FIG. 6B or FIG. 7B) represent corresponding conductive elements in the layout design (e.g., FIG. 6A or FIG. 7A) for making the NAND gate cell 200. Each of the two active zones (e.g., 80p and 80n) in the layout design is represented by a horizontal vertical stick with the same shading pattern in the corresponding stick diagram. Each of the power rails (e.g., 102 and 104) in the layout design is represented by a horizontal line in the corresponding stick diagram. Each of the conductive segments (e.g., 261p, 261n, 266p, 266n, and 262) in the layout design is represented by a corresponding vertical line in the corresponding stick diagram. Each of the gate-strips (e.g., 246 and 242) in the layout design is represented by a corresponding vertical stick with the same shading pattern in the corresponding stick diagram.

In FIGS. 6A-6B, the routing lines (e.g., 212, 214, 216, and 218) in the metal layer M0 are orientated horizontally; in FIGS. 7A-7B, the routing lines (e.g., 221, 222, 225, 226, and 229) in the metal layer M0 are orientated vertically. Each of the horizontal routing lines (e.g., 212, 214, 216, and 218) in FIG. 6A is represented by a horizontal stick with the same shading pattern in FIG. 6B. Each of the vertical conducting tracks (e.g., 221, 222, 225, 226, and 229) in FIG. 7A is represented by a vertical stick with the same shading pattern in FIG. 7B.

In FIG. 6B and FIG. 7B, each cross-point between a gate-strip (e.g., 246 and 242) and an active zone (e.g., 80p and 80n) represents a gate of a transistor. Each cross-point (marked with "x") between a conductive segment (e.g., 261p, 261n, 266p, 266n, 262p, and 262n) and an active zone (e.g., 80p and 80n) represents a source/drain of a transistor.

In FIGS. 6A-6C and FIGS. 7A-7C, the NAND gate 200 has two p-channel transistors Ti and T2 formed with the p-type active zone 80p and two n-channel transistors T3 and T4 formed with the n-type active zone 80n. The gate of the p-channel transistor Ti and the gate of the n-channel transistor T3 are connected together with the gate-strip 246. The gate of the p-channel transistor T2 and the gate of the n-channel transistor T4 are connected together with the gate-strip 242. The conductive segment 261n conductively connects the source of the n-channel transistor T3 to the power rail 104. The drain of the n-channel transistor T3 and the source of the n-channel transistor T4 are conductively connected together by the diffusing regions in the n-type active zone 80n.

In FIGS. 6A-6C, the conductive segment 266p conductively connects the sources of the p-channel transistors T1 and T2 to the power rail 102. The conductive segment 261p conductively connects the drain of the p-channel transistor T1 to the horizontal routing line 212 through one of the vias VD. The conductive segment 262 conductively connects the drain of the p-channel transistor T2 to both the drain of the n-channel transistor T4 and the horizontal routing line 212. The horizontal routing line 212 is conductively connected to each of the conductive segment 261p and the conductive segment 262 through one of the vias VD. The horizontal routing line 212 provides the output ZN for the NAND gate. The horizontal routing line 218 is conductively connected to the gate-strip 246 through the via VG and provides the first input line A1 for the NAND gate. The horizontal routing line 216 is conductively connected to the gate-strip 242 through the via VG and provides the second input line A2 for the NAND gate.

In FIGS. 7A-7C, the conductive segment 261p conductively connects the source of the p-channel transistor T1 to the power rail 102, and the conductive segment 262p conductively connects the source of the p-channel transistor T2 to the power rail 102. The conductive segment 266p conductively connects the drains of the p-channel transistors T1 and T2 to the vertical routing line 225 through one of the vias VD. The conductive segment 262n conductively connects the drain of the n-channel transistor T4 to the vertical routing line 229 through one of the vias VD. The vertical routing lines 225 and 229 in the metal layer M0 are conductively connected together by a horizontal routing line 215 in another metal layer M1 through vias VIA0. The horizontal routing line 215 provides the output ZN for the NAND gate. The vertical routing line 226 is conductively connected to the gate-strip 246 through the via VG and provides the first input line A1 for the NAND gate. The vertical routing line 222 is conductively connected to the gate-strip 242 through the via VG and provides the second input line A2 for the NAND gate.

FIGS. 8A-8B and FIGS. 9A-9B are schematic diagrams of layout designs of two abutting cells separated by a spacer at their vertical cell boundary, in accordance with some embodiments. In the layout design of FIG. 8A, the NAND gate cell 200 in FIG. 7A is positioned at the left of the cell for the inverter cell 100 in FIG. 5A, and the two cells are separated by a spacer 254/152. In the layout design of FIG. 9A, the NAND gate cell 200 in FIG. 7A is positioned at the right of the inverter cell 100 in FIG. 5A, and the two cells are separated by a spacer 154/252. In some embodiments, the pitch distance between the two poly-lines (for representing two corresponding gate-strips) in a cell defines a measuring unit, which is identified as a contact poly pitch (CPP). For example, in FIG. 8A and FIG. 9A, the distance between the middle line of the gate-strip 246 and the middle line of the gate-strip 242 is one CPP.

Figure 8A:
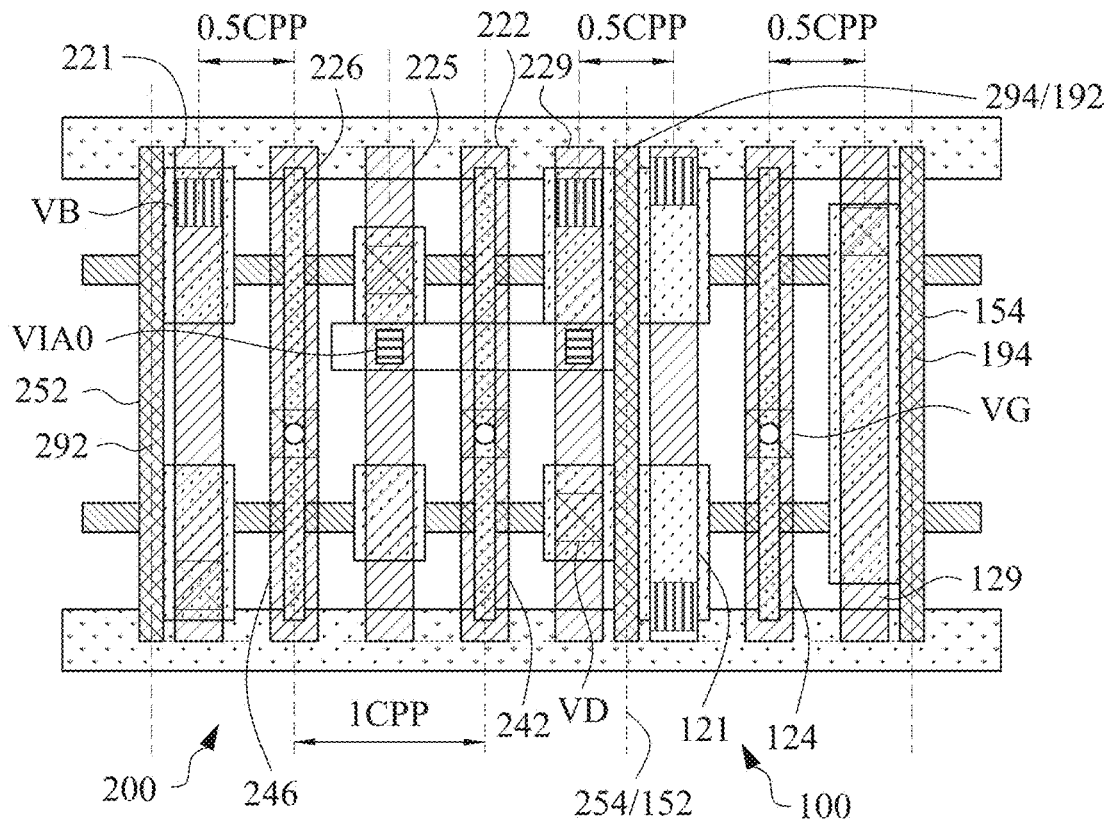
FIGS. 8A-8B and FIGS. 9A-9B are schematic diagrams of layout designs of two abutting cells separated by a spacer at their vertical cell boundary, in accordance with some embodiments.
Figure 9A:
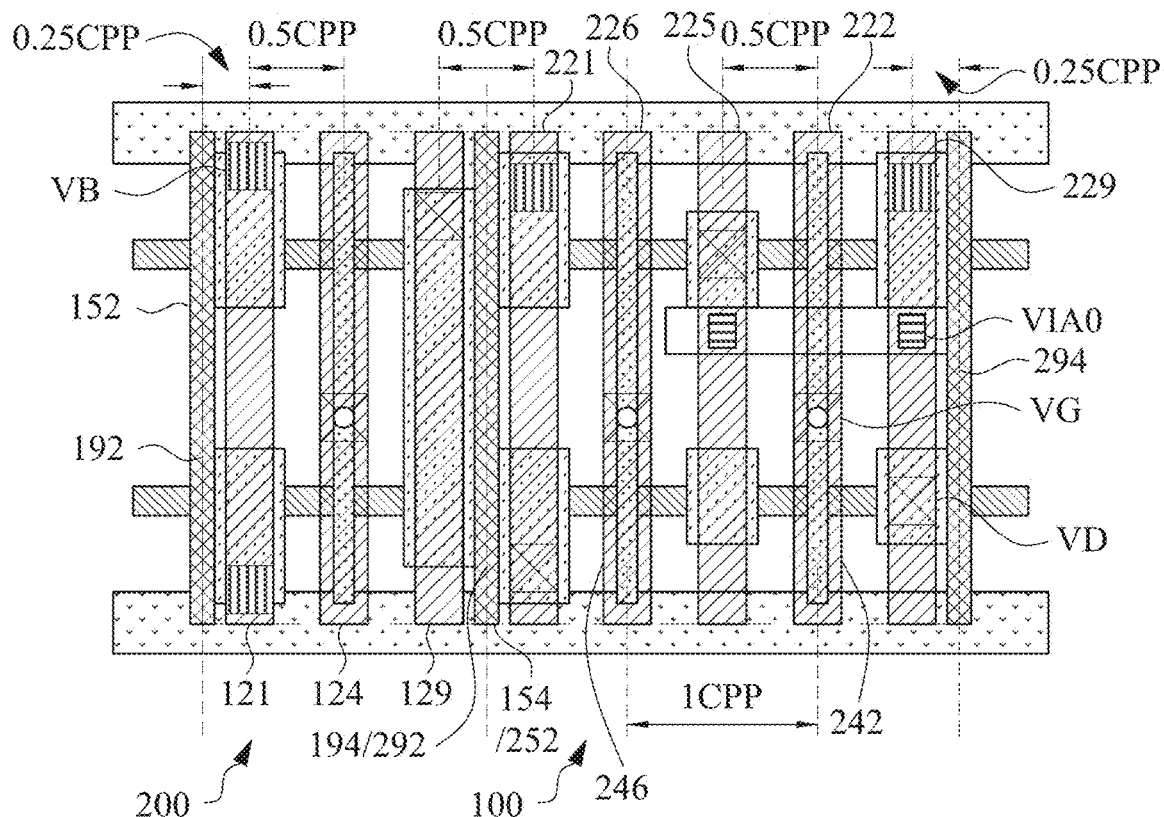

In FIG. 8A and FIG. 9A, the vertical routing lines (e.g., 221, 226, 225, 222, 229, 121, 124, and 129) are positioned with uniform pitch distance. The pitch distance between two neighboring vertical routing lines is uniformly 0.5 CPP. The pitch distance between two neighboring vertical routing lines in a same cell is 0.5 CPP. The pitch distance between two neighboring vertical routing lines in each of different cells is also 0.5 CPP. For example, the pitch distance between the vertical routing lines 229 and 121 in FIG. 8A is 0.5 CPP; and the pitch distance between the vertical routing lines 129 and 221 in FIG. 9A is 0.5 CPP.

Figure 8B:
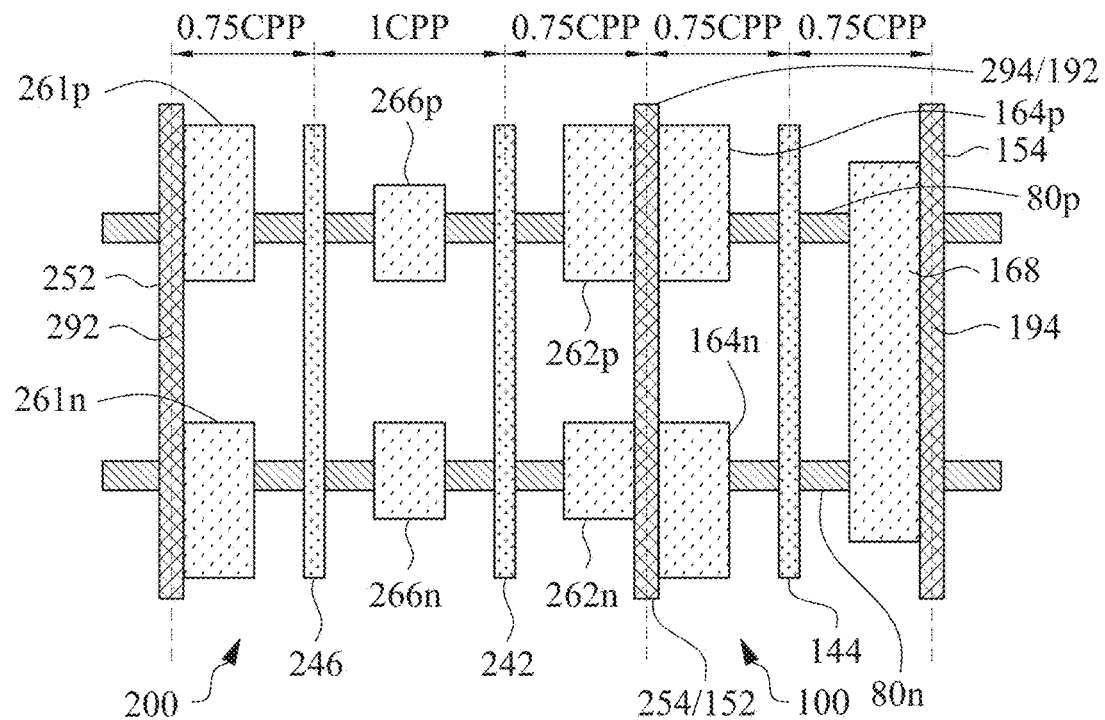
Figure 9B:
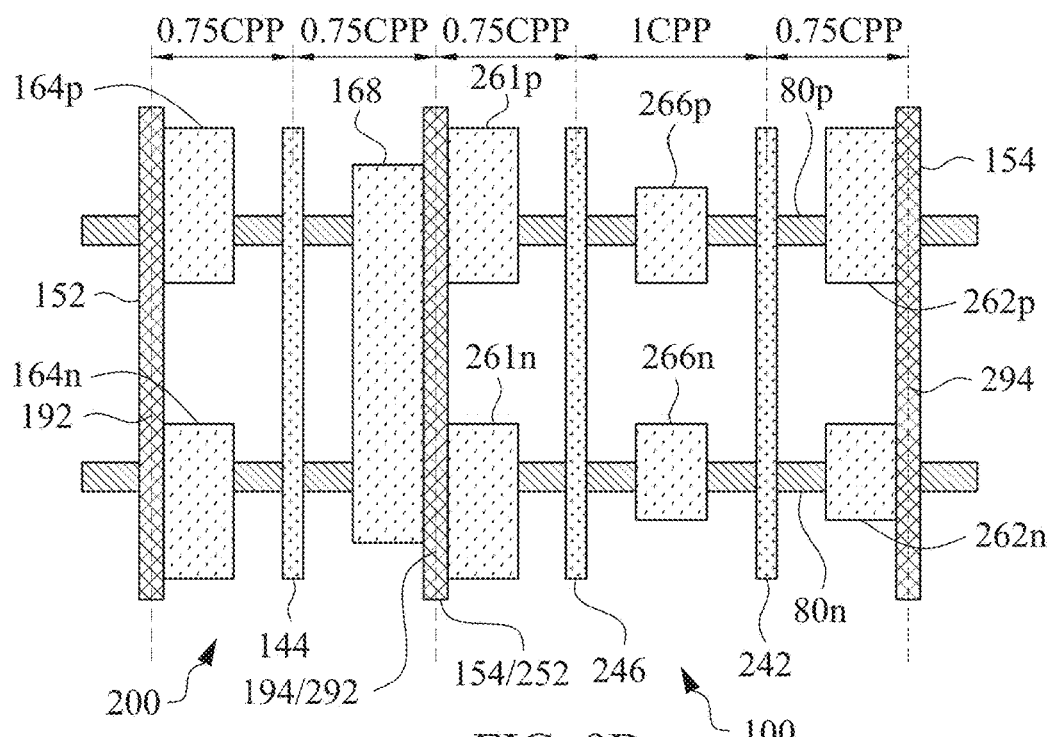

FIG. 8B is a simplified schematic diagram of the layout design in FIG. 8A after removing the layout patterns for the power rails and for the routing lines. FIG. 9B is a simplified schematic diagram of the layout design in FIG. 9A after removing the layout patterns for the power rails and for the routing lines. In FIG. 8B, the pitch distance from the gate-strip 242 to the vertical cell boundary 294 of the cell 200 is 0.75 CPP, and the pitch distance from the gate-strip 144 to the vertical cell boundary 192 of the cell 100 is 0.75 CPP. Consequently, the pitch distance between the gate-strip 242 in the cell 200 and the gate-strip 144 in the cell 100 is 1.5 CPP. In FIG. 9B, the pitch distance from the gate-strip 144 to the vertical cell boundary 194 of the cell 200 is 0.75 CPP, and the pitch distance from the gate-strip 246 to the vertical cell boundary 292 of the cell 200 is 0.75 CPP. Consequently, the pitch distance between the gate-strip 144 in the cell 100 and the gate-strip 246 in the cell 200 is 1.5 CPP.

The total cell width of the inverter cell 100 and the NAND gate cell 200 is smaller than a total cell width of an inverter cell and a NAND gate cell based on continuous poly on diffusion edge (CPODE) technology. With CPODE technology, a dummy PO line is at the vertical cell boundary between the two neighboring conductive segments on either side of the vertical cell boundary separating two abutting cells. With CPODE technology, there is a first space from the dummy PO line to the first one of the two neighboring conductive segments (which is in the first cell), and there is a second space from the dummy PO line to the second one of the two neighboring conductive segments (which is in the second cell). In FIG. 8B and FIG. 9B, the total cell width of the inverter cell 100 and the NAND gate cell 200 is reduced, because the two neighboring conductive segments on either side of the vertical cell boundary (between the two abutting cells 100 and 200) is separated by one spacer. The dummy PO line at the vertical cell boundary for CPODE is removed. The first space and the second space from the dummy PO line to the corresponding conductive segment for CPODE is also removed. In accordance with one or more embodiments, the reduction of the cell widths improves the circuit density of IC circuits.

In FIG. 8B and FIG. 9B, the layout design includes a p-type active zone 80p and an n-type active zone 80n forming two parallel active zones each extending in the X-direction. A spacer, extending in the Y-direction, divides each of the two parallel active zones (e.g., 80p and 80n) into a first part in a first cell and a second part in a second cell.

In FIG. 8B, the gate-strip 242 in the cell 200 crosses over the two parallel active zones (e.g., 80p and 80n) at a first side of the spacer 254/152, and the gate-strip 144 in the cell 100 crosses over the two parallel active zones (e.g., 80p and 80n) at a second side of the spacer 254/152. The conductive segment 262p in the cell 200 crosses over and forms active region contact with the p-type active zone 80p at the first side of the spacer 254/152. The conductive segment 164p in the cell 100 crosses over and forms active region contact with p-type active zone 80p at the second side of the spacer 254/152. The spacer 254/152 joins the conductive segment 262p with the conductive segment 164p, while preventing conductive contact between these two conductive segments (i.e., 262p and 164p). The conductive segment 262n in the cell 200 crosses over and forms active region contact with the n-type active zone 80n at the first side of the spacer 254/152. The conductive segment 164n in the cell 100 crosses over and forms active region contact with the n-type active zone 80n at the second side of the spacer 254/152. The spacer 254/152 joins the conductive segment 262n with the conductive segment 164n, while preventing conductive contact between these two conductive segments (i.e., 262n and 164n).

In FIG. 9B, the gate-strip 144 in the cell 100 crosses over the two parallel active zones (e.g., 80p and 80n) at a first side of the spacer 154/252, and the gate-strip 246 in the cell 200 crosses over the two parallel active zones (e.g., 80p and 80n) at a second side of the spacer 154/252. The conductive segment 168 in the cell 100 crosses over and forms active region contacts with both the p-type active zone 80p and the n-type active zone 80n at the first side of the spacer 154/252. The conductive segment 261p in the cell 200 crosses over and forms active region contact with the p-type active zone 80p at the second side of the spacer 154/252. The conductive segment 261n in the cell 200 crosses over and forms active region contact with the n-type active zone 80n at the second side of the spacer 154/252. The spacer 154/252 joins the conductive segment 168 with the conductive segments 261p and 261n, while preventing the conductive segment 168 from conductively contacting the conductive segments 261p and 261n.

Figure 10A:
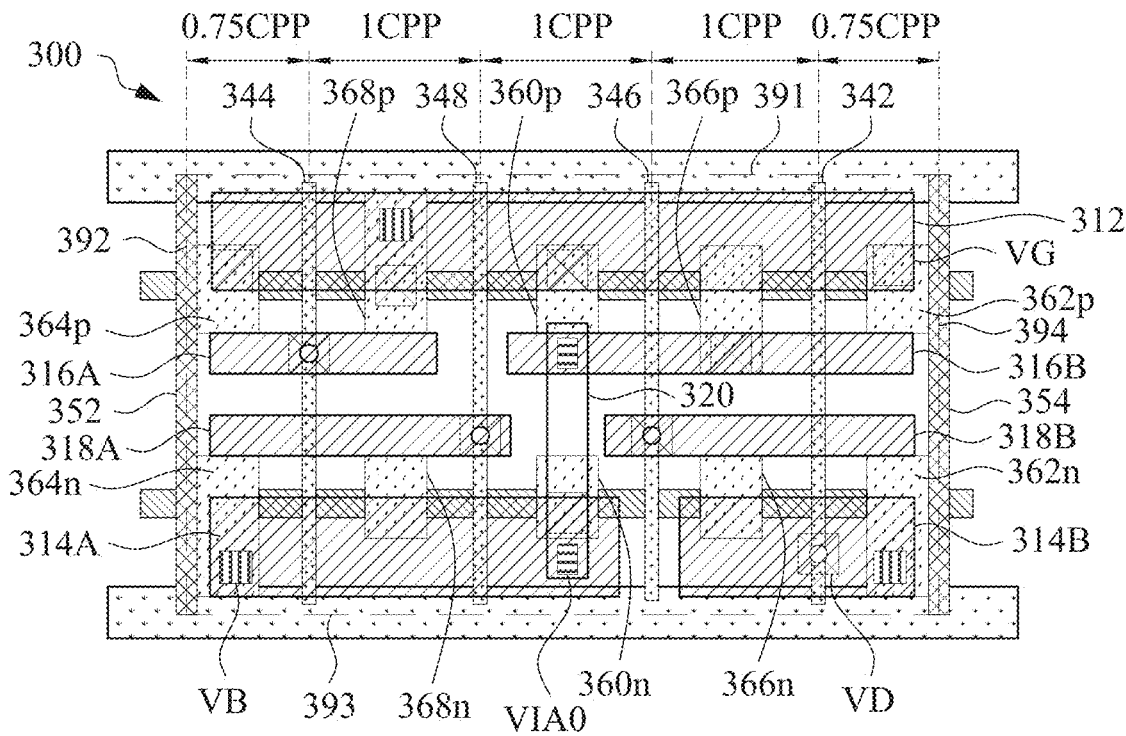
FIG. 10A is a schematic diagram of a layout design of an AND-OR-INVERT logic cell having spacers at vertical cell boundaries, in accordance with some embodiments.
Figure 10B:
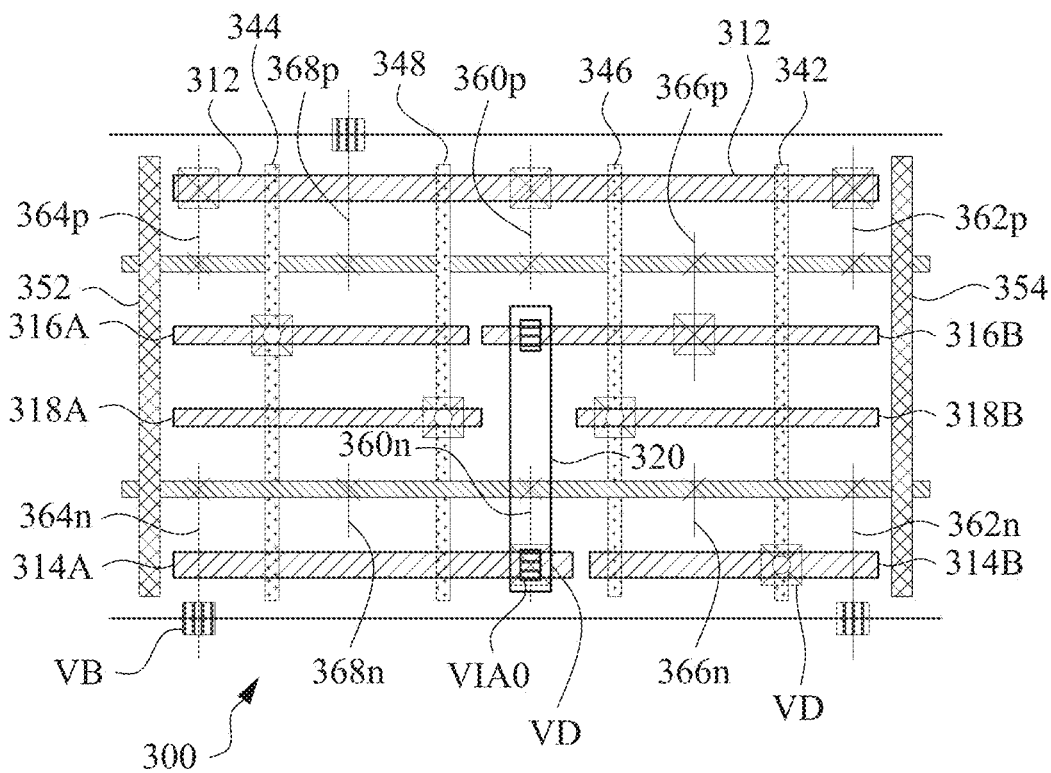
FIG. 10B is a stick diagram of the AND-OR-INVERT logic cell in the layout design of FIG. 10A, in accordance with some embodiments.
Figure 10C:
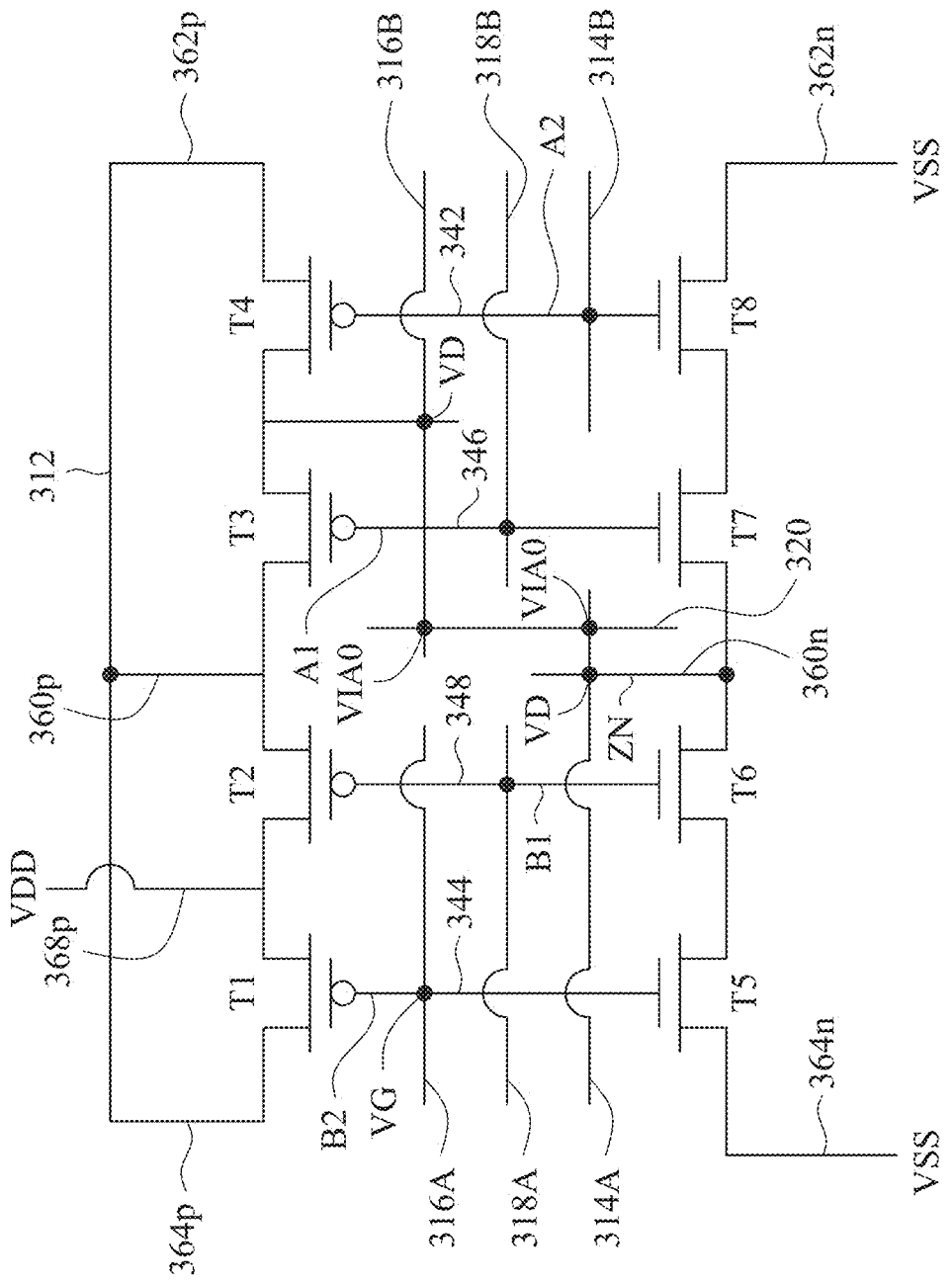
FIG. 10C is a circuit diagram of the AND-OR-INVERT logic circuit in FIG. 10B, in accordance with some embodiments.
Figure 11A:
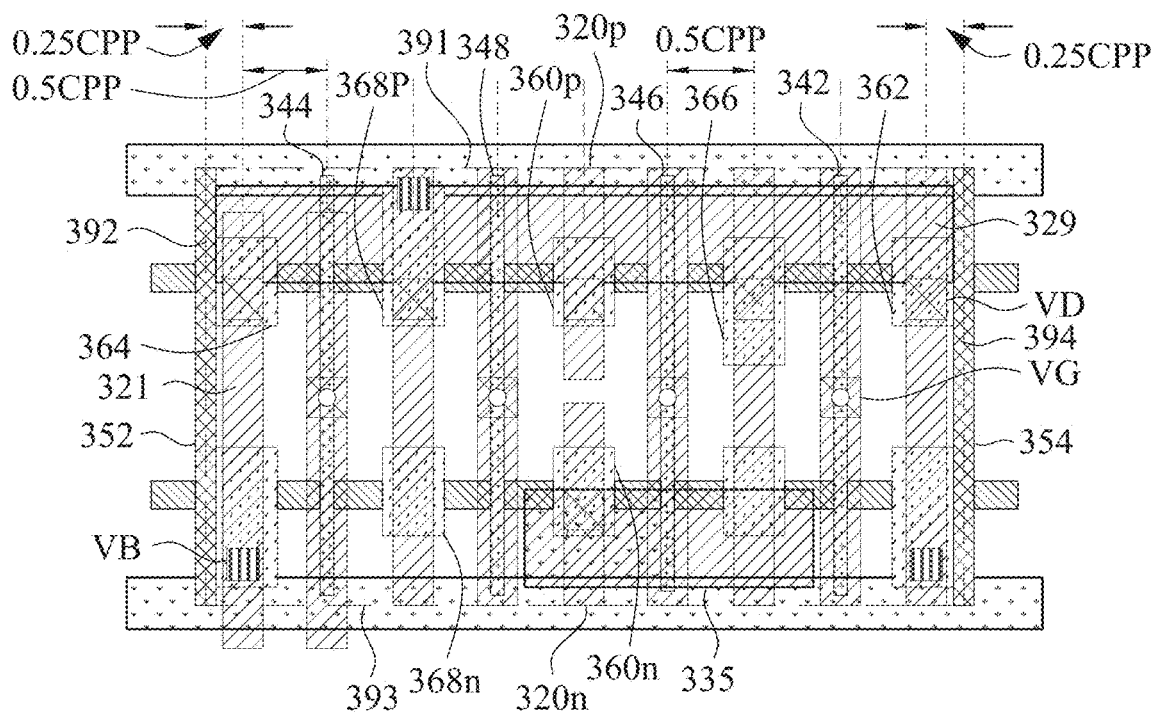
FIG. 11A is a schematic diagram of another layout design of an AND-OR-INVERT logic cell having spacers at vertical cell boundaries, in accordance with some embodiments.
Figure 11B:
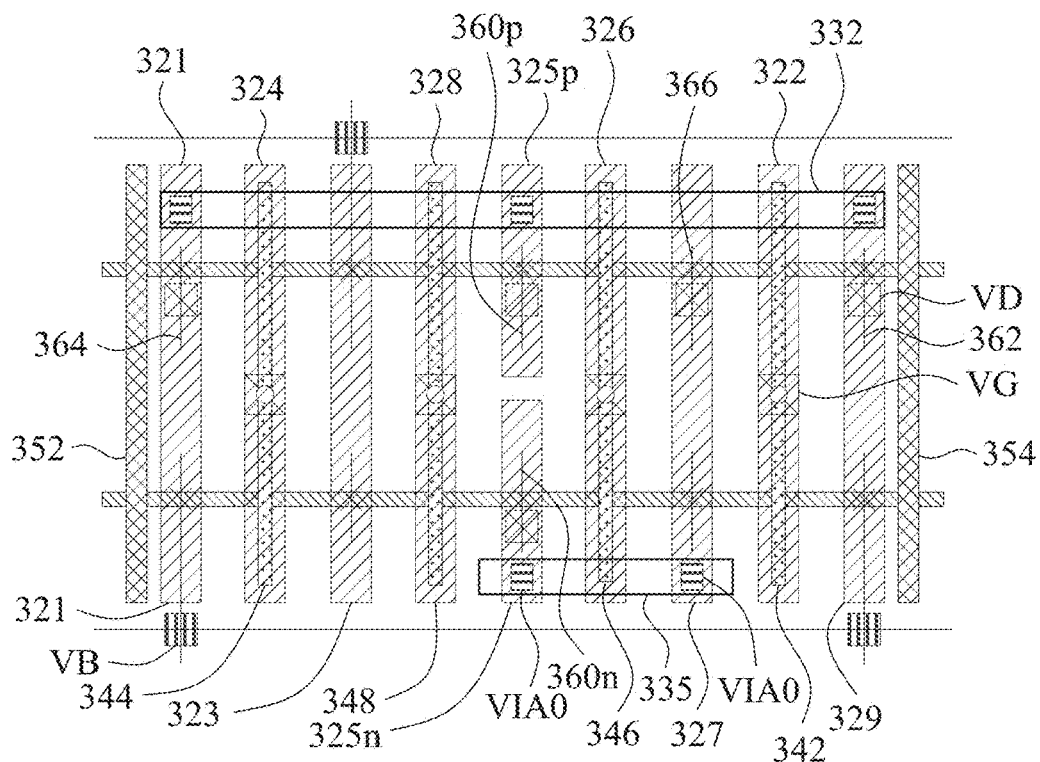
FIG. 11B is a stick diagram of the AND-OR-INVERT logic cell in the layout design of FIG. 11A, in accordance with some embodiments.
Figure 11C:
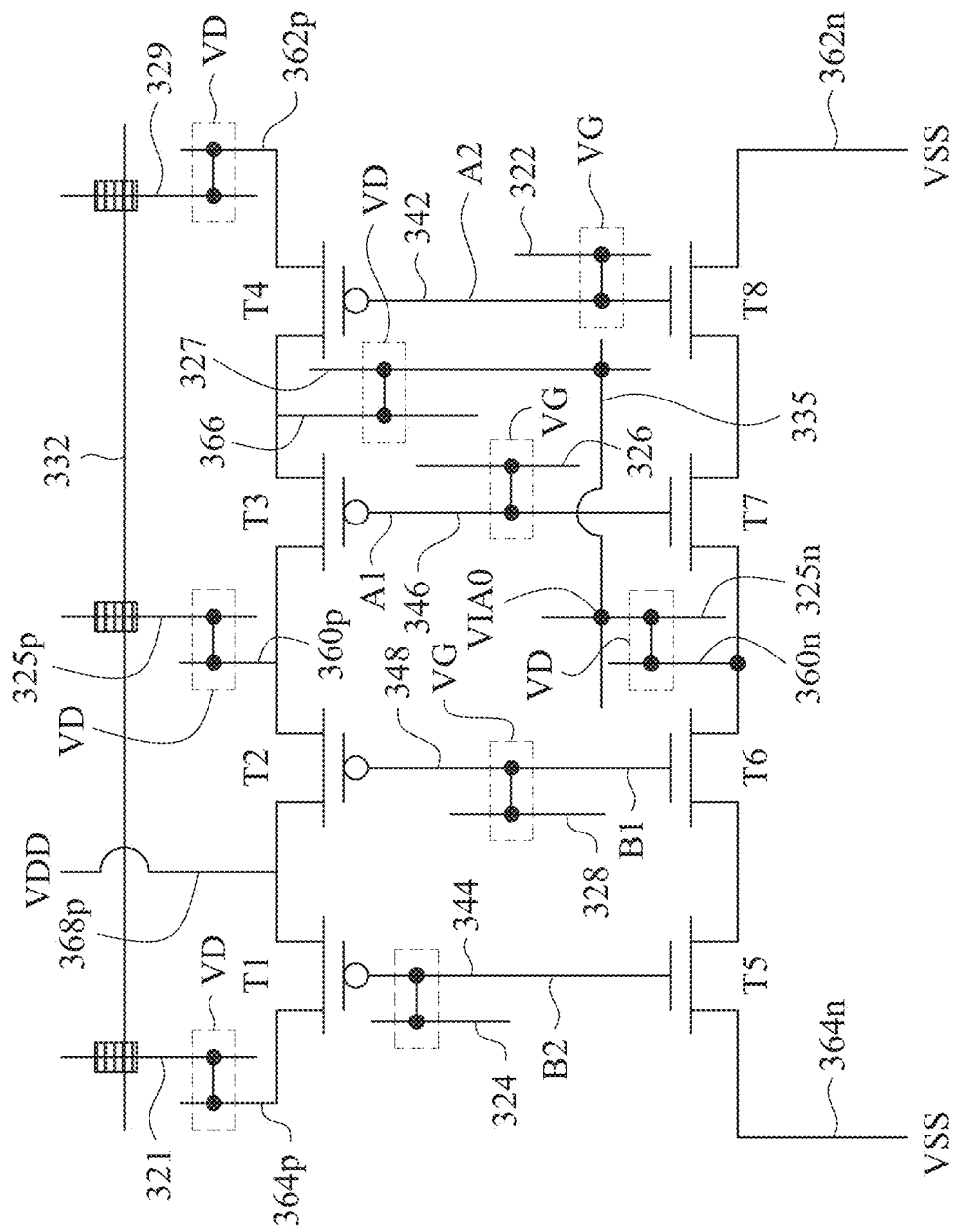
FIG. 11C is a circuit diagram of the AND-OR-INVERT logic circuit in FIG. 11B, in accordance with some embodiments.

FIG. 10A is a schematic diagram of a layout design of an AND-OR-INVERT logic (e.g., AO122) cell 300 having spacers at vertical cell boundaries, in accordance with some embodiments. FIG. 10B is a stick diagram of the AO122 cell 300 in the layout design of FIG. 10A. FIG. 10C is a circuit diagram of the AO122 circuit in FIG. 10B. FIG. 11A is a schematic diagram of another layout design of a AO122 cell 300 having spacers at vertical cell boundaries, in accordance with some embodiments. FIG. 11B is a stick diagram of the AO122 cell 300 in the layout design of FIG. 11A. FIG. 11C is a circuit diagram of the AO122 circuit in FIG. 11B. In FIG. 10A and FIG. 11A, the AO122 cell 300 is placed between two power rails 102 and 104. The power rails 102 and 104 correspondingly provide the first supply voltage VDD and the second supply voltage VSS to the AO122 cell 300. The AO122 cell 300 in FIG. 10A and FIG. 11A has horizontal boundaries (e.g., 391 and 393) and vertical boundaries (e.g., 392 and 394).

Most of the conductive elements for making the AO122 circuit in the layout design (e.g., FIG. 10A or FIG. 11A) are represented with various sticks and connections in its corresponding stick diagram (e.g., FIG. 10B or FIG. 11B). Each of the two active zones (e.g., 80p and 80n) in the layout design is represented by a horizontal vertical stick with the same shading pattern in the corresponding stick diagram. Each of the power rails (e.g., 102 and 104) in the layout design is represented by a horizontal line in the corresponding stick diagram. Each of the conductive segments (e.g., 364p, 364n, 368p, 368n, 360p, 360n, 366p, 366n, 362p, and 362n) in the layout design is represented by a corresponding vertical line in the corresponding stick diagram. Each of the gate-strips (e.g., 344, 348, 346, and 342) in the layout design is represented by a corresponding vertical stick with the same shading pattern in the corresponding stick diagram.

In FIGS. 10A-10B, the routing lines (e.g., 312, 316A, 316B, 318A, 318B, 314A, and 314B) in the metal layer M0 are orientated horizontally; in FIGS. 11A-11B, the routing lines (e.g., 320p, 320n, and 321-329) in the metal layer M0 are orientated vertically. Each of the horizontal routing lines (e.g., 312, 316A, 316B, 318A, 318B, 314A, and 314B) in FIG. 10A is represented by a horizontal stick with the same shading pattern in FIG. 10B. Each of the vertical conducting tracks (e.g., 320p, 320n, and 321-329) in FIG. 11A is represented by a vertical stick with the same shading pattern in FIG. 11B.

In FIG. 10B and FIG. 11B, each cross-point between a gate-strip (e.g., 344, 348, 346, and 342) and an active zone (e.g., 80p and 80n) represents a gate of a transistor. Each cross-point (marked with "x") between a conductive segment (e.g., 364p, 364n, 368p, 368n, 360p, 360n, 366p, 366n, 362p, and 362n) and an active zone (e.g., 80p and 80n) represents a source/drain of a transistor.

In FIGS. 10A-10C and FIGS. 11A-11C, the AOI22 cell 300 has four p-channel transistors (e.g., T1, T2, T3, and T4) formed with the p-type active zone 80p and four n-channel transistors (T5, T6, T7, and T8) formed with the n-type active zone 80n. Each of the gate-strips 344, 348, 346, and 342 connects the gate of one p-channel transistor with the gate of one corresponding n-channel transistor (e.g., T1 with T5, T2 with T6, T3 with T7, and T4 with T8). The semiconductor channels of the four p-channel transistors (e.g., T1, T2, T3, and T4) are connected in series within the p-type active zone 80p in the form of continuous oxide diffusion (CNOD). The semiconductor channels of the four n-channel transistors (e.g., T5, T6, T7, and T8) are connected in series within the n-type active zone 80n in the form of continuous oxide diffusion (CNOD). The sources of the p-channel transistors T1 and T2 are conductively connected to the first power supply VDD on power rail 102 (for example, through the via VB). The sources of the n-channel transistors T5 and T8 are conductively connected to the second power supply VSS on power rail 104 (for example, through the via VB).

In FIGS. 10A-10C, the drains of the p-channel transistors T1 and T2 and the sources of the p-channel transistors T3 and T4 are connected together, after the conductive segments 364p, 360p, and 362p are conductively connected together by the horizontal routing line 312 though the vias VD. The drains of the p-channel transistors T3 and T4 and the drains of the n-channel transistors T6 and T7 are connected together, after the conductive segments 366p and 360n are conductively connected together with the combination of the vertical routing line 320 and the horizontal routing lines 316B and 314A. The horizontal routing lines 316B and 314A are conductively connected together with the vertical routing line 320 through the vias VIA0, while the conductive segments 366p and 360n are correspondingly connected to the horizontal routing lines 316B and 314A. The horizontal routing lines 316A, 318A, 318B, and 314B are correspondingly connected to the gate-strips 344, 348, 346, and 342 to provide the inputs (e.g., B2, B1, A1, and A2) for the AO122 circuit. The output ZN is on either one of the horizontal routing lines 316B and 314A.

In FIG. 10A, the pitch distance from the gate-strip 344 to the vertical cell boundary 392 is 0.75 CPP, and the pitch distance from the gate-strip 342 to the vertical cell boundary 394 is 0.75 CPP. If the cell 300 in FIG. 10A is positioned abutting the cell 100 in FIG. 5A or positioned abutting the cell 200 in FIG. 6A, the pitch distance between the two gate-strips on either side of the spacer at the common vertical boundary of the two cells can be set to 1.5 CPP.

In FIGS. 11A-11C, the conductive segments 364, 360p, 360n, 366, and 362 are correspondingly connected to the vertical routing lines 321, 325p, 325n, 327, and 329 through vias VD. The drains of the p-channel transistors T1 and T2 and the sources of the p-channel transistors T3 and T4 are connected together, after the vertical routing lines 321, 325p, and 329 are conductively connected together by the horizontal routing line 332 in the metal layer M1 through one of the vias VIA0. The drains of the p-channel transistors T3 and T4 and the drains of the n-channel transistors T6 and T7 are connected together, after the vertical routing lines 325n and 327 are conductively connected together by the horizontal routing line 335 in the metal layer M1 through one of the vias VIA0. The vertical routing lines 324, 328, 326, and 322 are correspondingly connected to the gate-strips 344, 348, 346, and 342 to provide the inputs (e.g., B2, B1, A1, and A2) for the AO122 circuit 300. The output ZN is on the horizontal routing line 335.

In FIG. 11A, the vertical routing lines (e.g., 321, 324, 323, 328, 325p aligned with 325n, 326, 327, 322, and 329) are positioned with uniform pitch distance. The pitch distance between two neighboring vertical routing lines is uniformly 0.5 CPP. Additionally, the pitch distance from the vertical routing line 321 to the vertical cell boundary 392 is 0.25 CPP, and the pitch distance from the vertical routing line 329 to the vertical cell boundary 394 is 0.25 CPP. If the cell 300 in FIG. 11A is positioned abutting the cell 100 in FIG. 5A or abutting the cell 200 in FIG. 6A, the pitch distance between two neighboring vertical routing lines in the layout of the two cells is uniformly 0.5 CPP. Similar to the layout of the two cells in FIGS. 8A and 9A, the pitch distance between the two neighboring vertical routing lines on either side of the spacer at the common vertical boundary of the two cells can be set to 0.5 CPP.

In the embodiments of FIG. 6A, FIG. 7A, FIG. 8A, FIG. 9A, and FIG. 10A, the supply voltages for the circuit cells are conducted through buried power rails 102 and 104. In other embodiments, the supply voltages for the circuit cells are conducted through the power rails in the first metal layer or in another metal layer for making conductive routing lines. In some embodiments, the supply voltages for the circuit cells can be conducted though the power rails 202 and 204 in the first metal layer M0 (e.g., similar to the power rails in FIG. 4E). In some embodiments, the supply voltages for the circuit cells can be conducted though the power rails 302 and 304 in the second metal layer M1 (e.g., similar to the power rails in FIG. 5D).

Figure 12A:
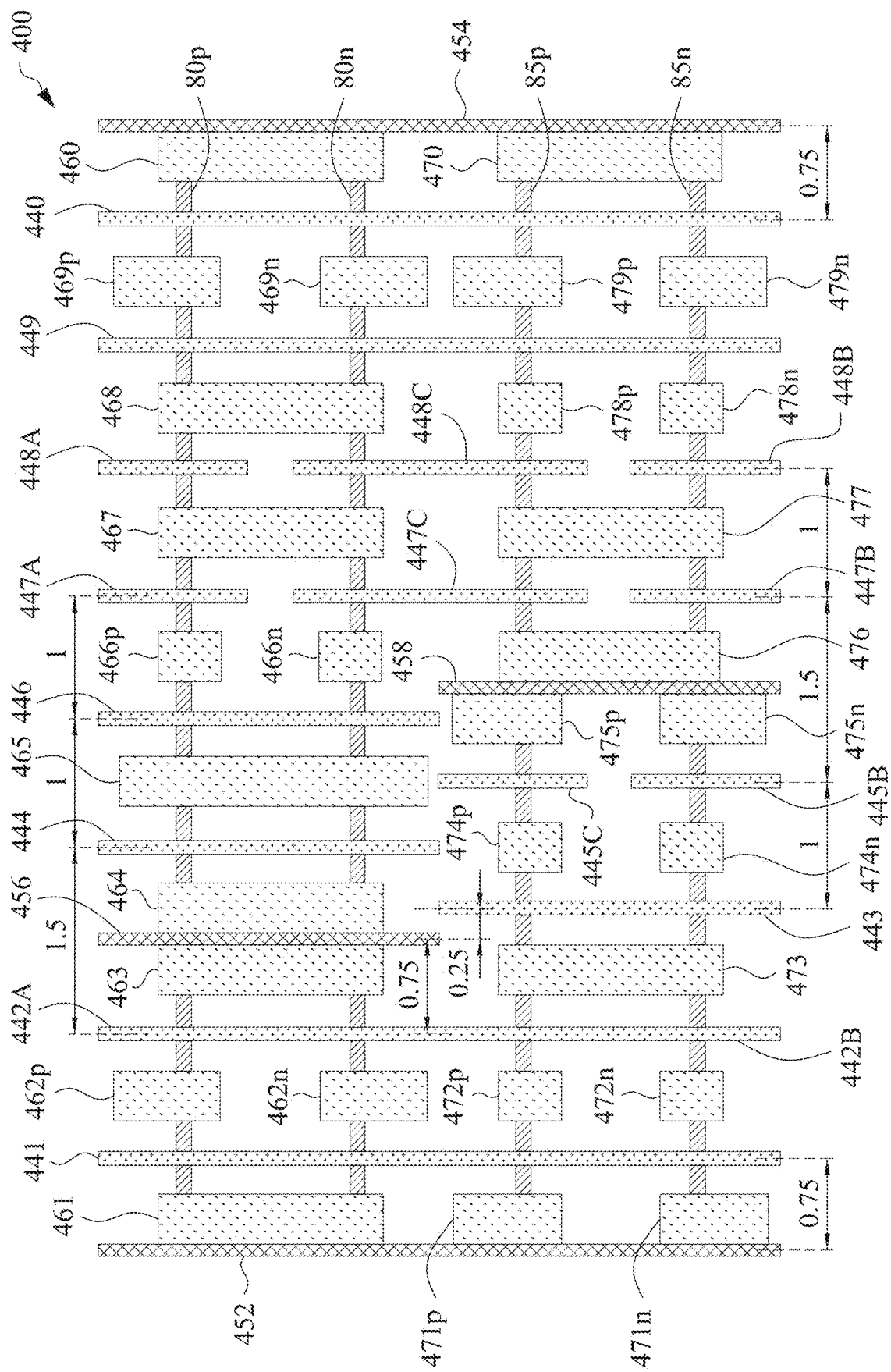
FIG. 12A and FIG. 12B are schematic diagrams of a layout design of a cell having spacers inside the cell and at its boundaries, in accordance with some embodiments.
Figure 12B:
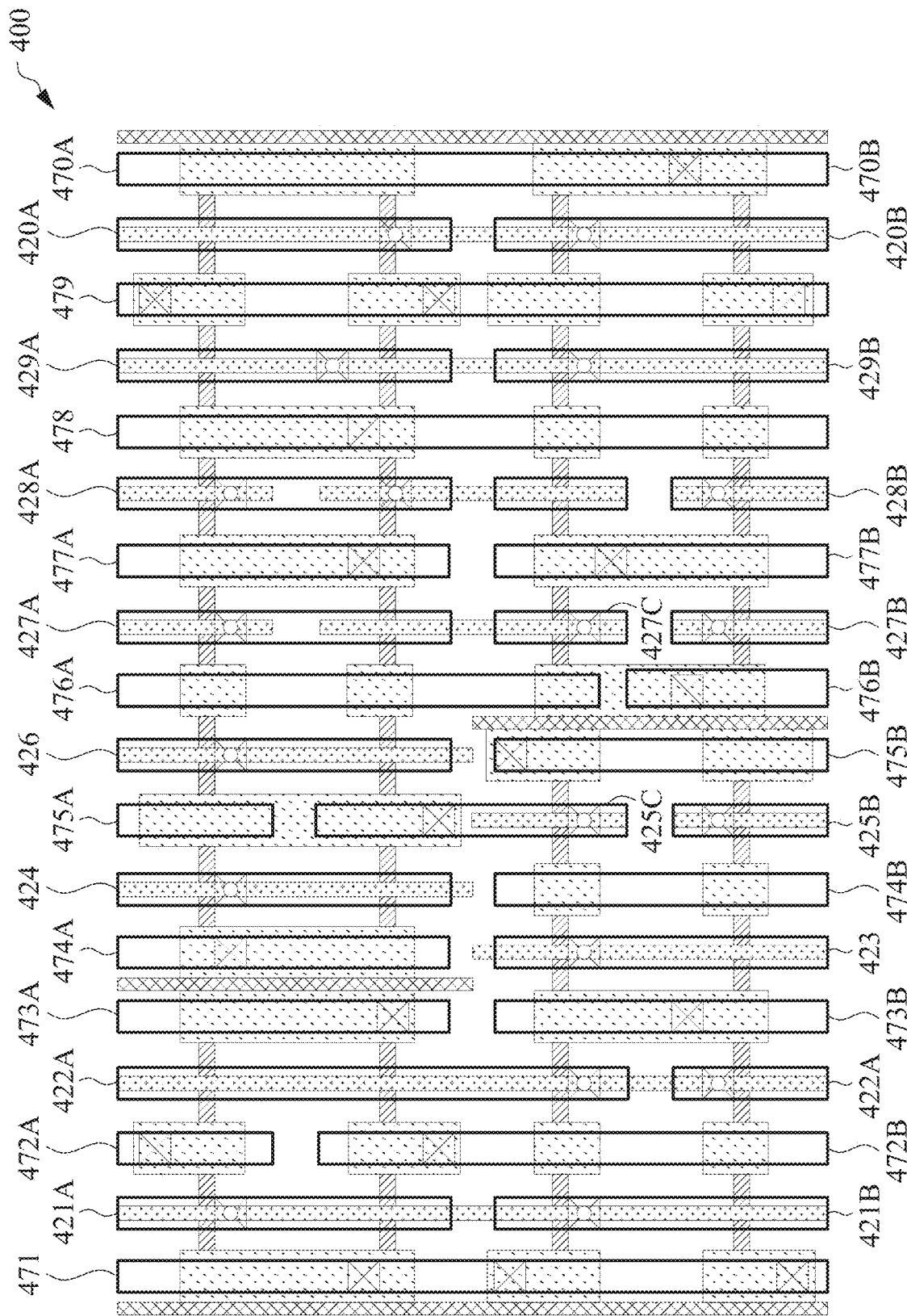

FIG. 12A and FIG. 12B are schematic diagrams of a layout design of a cell 400 having spacers inside the cell and at its boundaries, in accordance with some embodiments. In FIG. 12A, certain elements (e.g., the active zones, the gate-strips, and the conductive segments in the middle layer) below the first metal layer is shown in corresponding layout patterns. In FIG. 12B, routing lines in the first metal layer is shown in corresponding layout patterns, while the layout patterns in FIG. 12A for specifying the elements below the first metal layer is shown as faint background.

In FIG. 12A, the cell 400 includes spacers (452 and 454) at its vertical boundaries, spacers (456 and 458) inside the cell, p-type active zones (80p & 85p), and n-type active zones (80n & 85n). The cell 400 includes gate-strips 441, 442 (A & B), 443, 444, 445 (C & B), 446, 447(A, B, &C), 448(A, B, &C), 449, and 440. The cell 400 also includes conductive segments 461, 462(p & n), 463, 464, 465, 466 (p & n), 467, 468, 469(p & n), 460, 471(p & n), 472 (p & n), 473, 474 (p & n), 475(p & n), 476, 477, 478 (p & n), 479(p & n), and 470. The spacer 456 divides the active zones 80p and 80n, and isolates two neighboring conductive segments 463 and 464. The spacer 458 divides the active zones 85p and 85n, and isolates each of the conductive segments 475p and 475n with its neighboring conductive segment 476.

In FIG. 12A, the pitch distance between two neighboring gate-strips is 1 CPP, if there is no in-cell spacer (e.g., 456 or 458) between the two neighboring gate-strips. For example, the pitch distance between gate-strips 441 and 442 (A & B) is 1 CPP, and the pitch distance gate-strips 443 and 445 (C & B) is 1 CPP.

In FIG. 12A, the pitch distance between two neighboring gate-strips is 1.5 CPP, if there is one in-cell spacer (e.g., 456 or 458) between the two neighboring gate-strips. For example, the pitch distance between gate-strips 442 (A&B) and 444 is 1.5 CPP, and the pitch distance between gate-strips 445(C&B) and 447(A, B &C) is 1.5 CPP.

In FIG. 12A, the pitch distance between a gate-strip and its neighboring spacer (e.g., 452, 454, 456, or 458) is 0.75 CPP. For example, the pitch distance between gate-strips 441 and the spacer 452 is 0.75 CPP, the pitch distance between gate-strips 440 and the spacer 454 is 0.75 CPP, the pitch distance between the spacer 456 and its neighboring gate-strips (e.g., 442A, 442B, or 444) is 0.75 CPP, and the pitch distance between the spacer 458 and its neighboring gate-strips (e.g., 445 (C&B) or 447(A, B, &C)) is 0.75 CPP.

When the pitch distance (Lgg=1 CPP) between two neighboring gate-strips is subtracted by the pitch distance (Lgs=0.75 CPP) between a gate-strip and its neighboring spacer, the difference of the two pitch distances (Lgg-Lgs=0.25 CPP) defines a poly-jog base unit. The pitch distance between two gate-strips, the pitch distance between two spacers, and the pitch distance between one gate-strip and one spacer can be expressed as an integer multiple of the poly-jog base unit. For example, the pitch distance between the spacer 456 and the gate-strip 443 is 0.25 CPP, which is one poly-jog base unit. The pitch distance between gate-strips 442(A&B) and 444 is six (6) poly-jog base units. The pitch distance gate-strips 443 and 445(C&B) is four (4) poly-jog base units. The pitch distance between the spacers 452 and 456 is ten (10) poly-jog base units.

In FIG. 12B, the routing lines in the first metal layer include 421(A & B), 422(A & B), 423, 424, 425(A & B &C), 426 (A & B), 427(A & B &C), 428(A & B), 429(A & B), 420(A & B), 471, 472 (A & B), 473(A & B), 474 (A & B), 475 (A & B &C), 476(A & B), 477(A & B), 478, 479, and 470 (A & B). In FIG. 12B, the routing lines in the first metal layer are orientated vertically. The pitch distance between two neighboring routing lines can be measured in terms of the poly-jog base unit. For example, the pitch distance between any two neighboring routing lines in FIG. 12B is 0.5 CPP, which is two (2) poly-jog base units. Each of the vertical routing lines in FIG. 12B is aligned with one underlying gate-strip or conductive segment. Conductive contacts can be made between a vertical routing line and its corresponding underlying gate-strip or underlying conductive segment through one or more vias. For example, each of the gate-strips in FIG. 12A is conductively connected to one vertical routing line in FIG. 12B through one of the vias VG. A conductive segment can be conductively connected to one vertical routing line through one of the vias VD. For example, the conductive segments 463 and 464 are correspondingly connected to routing lines 473A and 474A through the via VD.

In FIG. 4A, FIG. 5A, FIG. 6A, FIG. 7A, FIG. 8A, FIG. 9A, FIG. 10A, FIG. 11A, and FIG. 12A, a width of the spacer (e.g., 152, 154, 252, 254, 352, 354, 452, 454, 456, and 458) is less than 0.5 CPP. In some embodiments, the width of the spacer is less than 0.25 CPP. In some embodiments, the width of the spacer is less than 0.2 CPP. In some embodiments, the width of the spacer is less than 0.1 CPP. In some embodiments, the width of the spacer is less than 0.05 CPP. In some embodiments, the width of the spacer is also less than 3 nm.

Figure 13A:
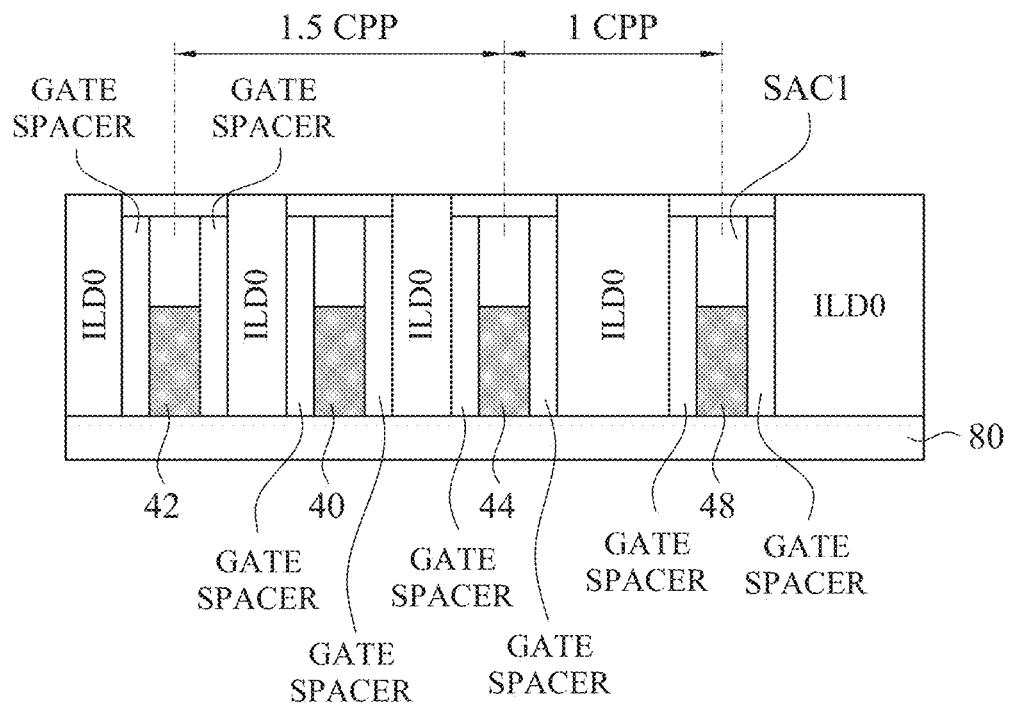
FIGS. 13A-13J are cross-sectional views of devices fabricated in the process for making a spacer that divides an active zone and isolates two neighboring conductive segments in the MD layer, in accordance with some embodiments.
Figure 13B:
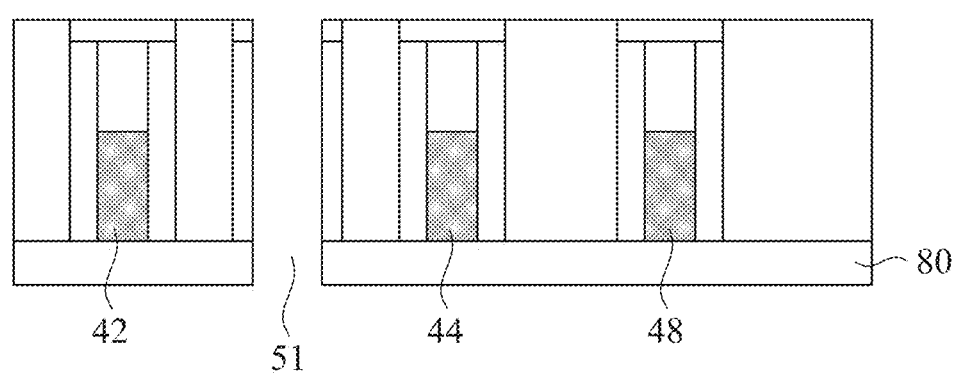
Figure 13C:
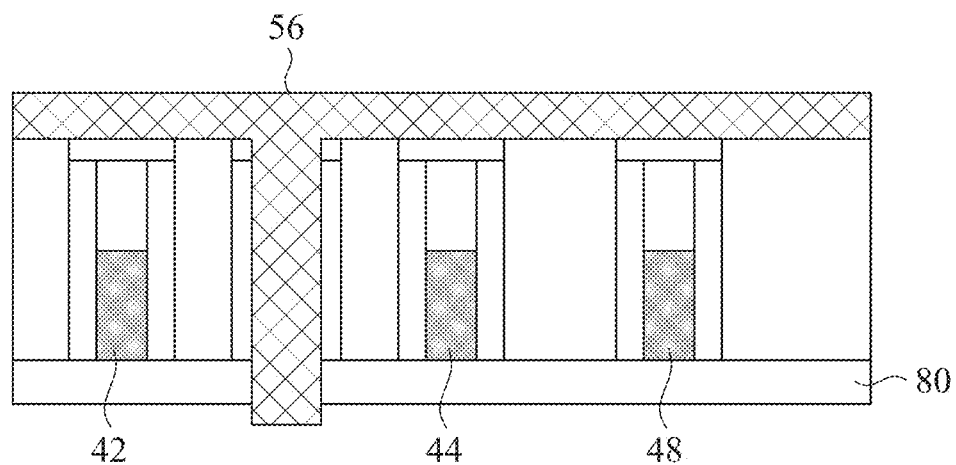
Figure 13D:
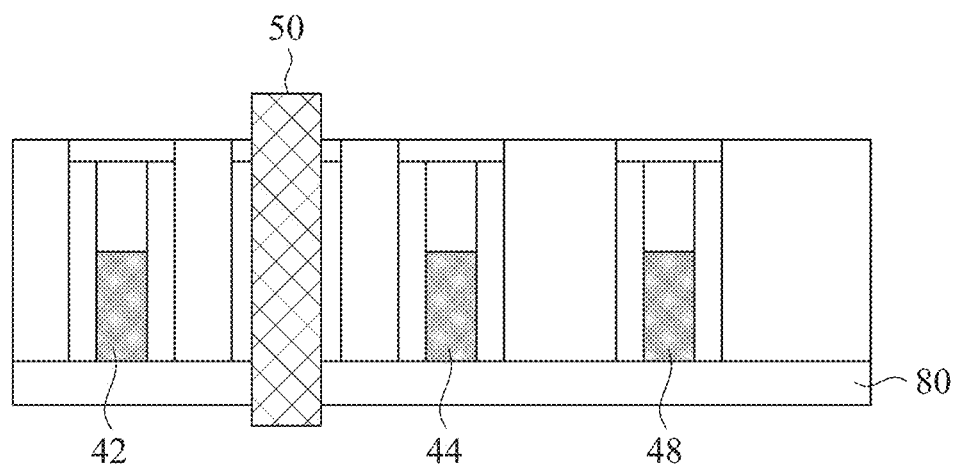
Figure 13E:
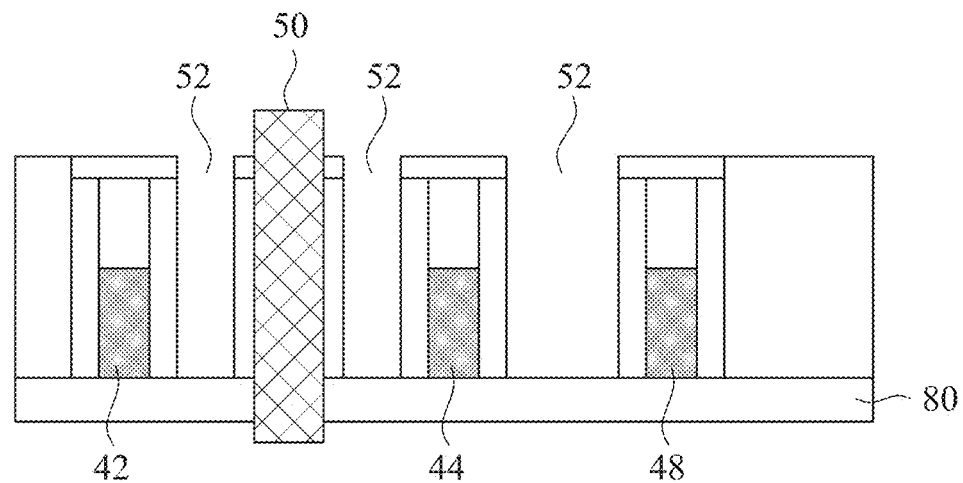
Figure 13F:
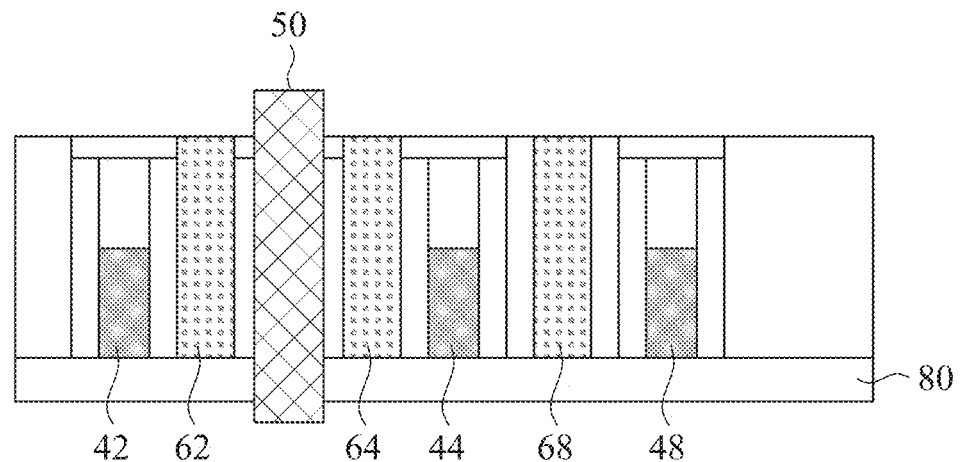
Figure 13G:
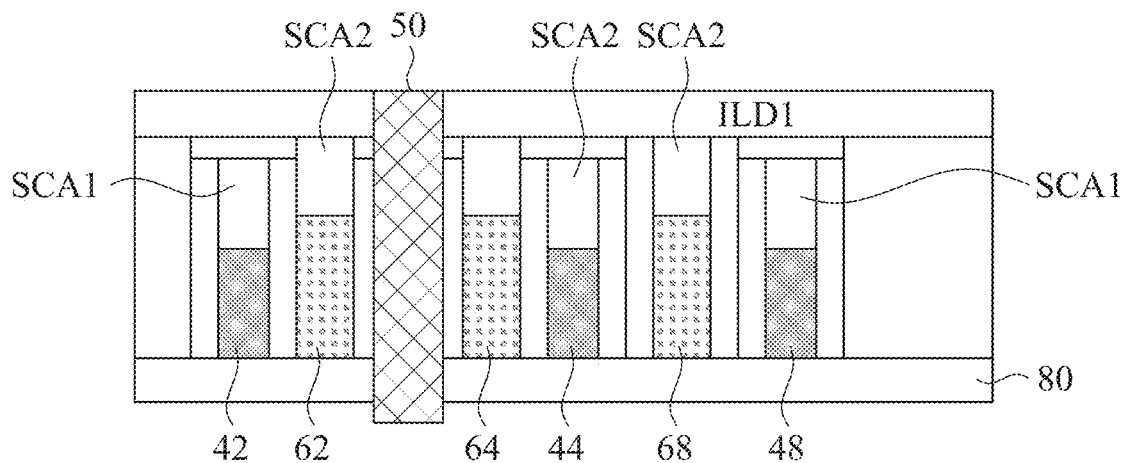
Figure 13H:
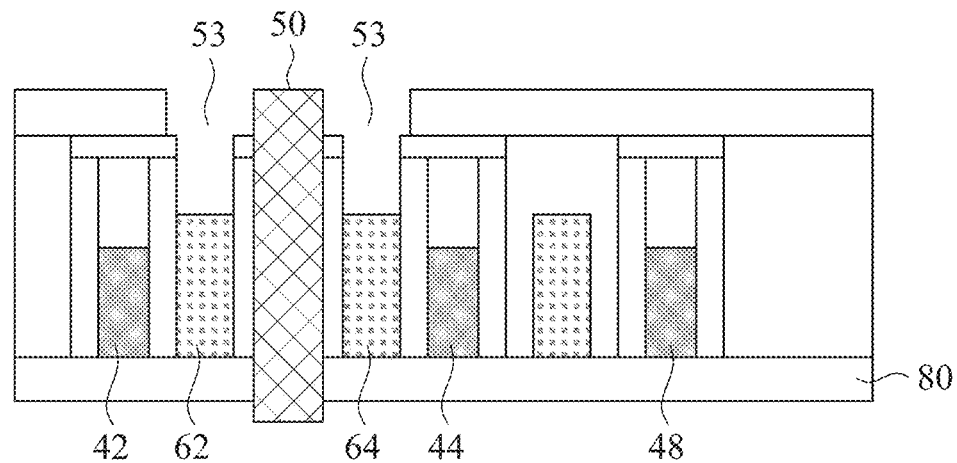
Figure 13I:
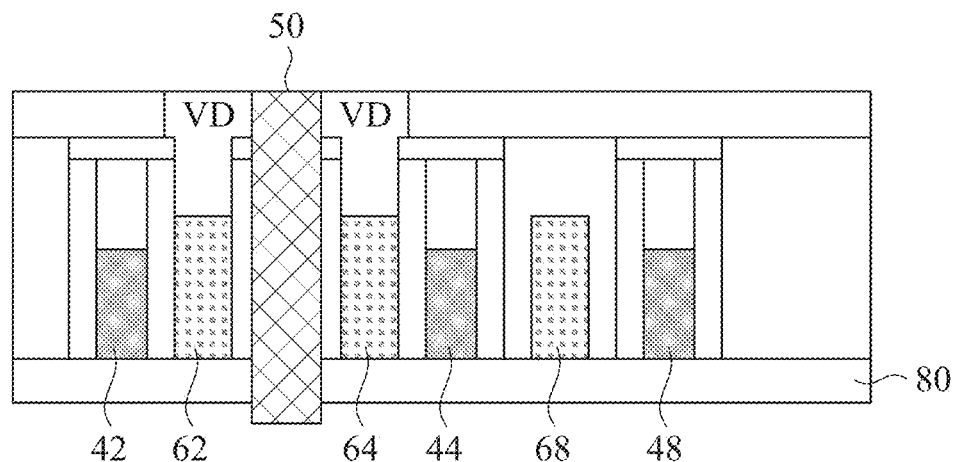
Figure 13J:
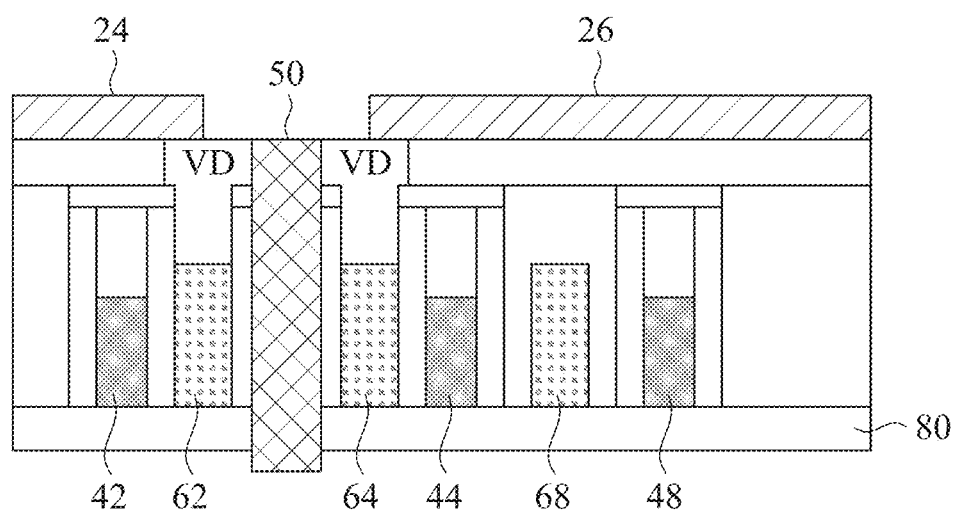

FIGS. 13A-13J are cross-sectional views of devices fabricated in the process for making a spacer that divides an active zone and isolates two neighboring conductive segments in the MD layer, in accordance with some embodiments. Before the spacer 50 in FIG. 13J is fabricated, gate-strips (e.g., 42, 44, and 48) crossing over the active zone 80 are fabricated on the semiconductor substrate, as shown in the cross-sectional view of FIG. 13A. In some embodiments, a gate-strip 40 between the gate-strips 42 and 44 is also fabricated on the semiconductor substrate. In some embodiments, before the spacer is fabricated, the active zone 80 as fabricated is in the form of a CNOD active zone. In FIGS. 13A-13J, the distance between the middle line of the gate-strip 44 and the middle line of the gate-strip 48 defines a measurement unit that is labeled as CPP ("Contacted Poly Pitch"). In the embodiments of FIG. 13A, the distance between the middle line of the gate-strip 42 and the middle line of the gate-strip 44 is 1.5 CPP. In FIG. 13A, gate spacers are fabricated on both sides of each gate-strip (e.g., 42, 44, 48, or 40). The gaps between the gate spacers are filled with inter-layer dielectric (e.g., ILD0). The tops of the gate-strips are covered with the insulation material SAC1 for making self-aligned contacts.

In the next step, as shown in FIG. 13B, an opening trench 51 is made at the location for fabricating the spacer 50. The opening trench 51 cut into the substrate and break the active zone 80 into two parts. In some embodiments, if there is a gate-strip 40 between the gate-strips 42 and 44, this gate-strip 40 is also removed during the process of making the opening trench 51.

In the next step, as shown in FIG. 13C, the opening trench 51 is filled with the insulation material 56 (e.g., silicon nitride Si3N4). Then, in the next step, as shown in FIG. 13D, excess insulation material 56 (e.g., silicon nitride Si3N4) are removed, and the spacer 50 is fabricated. The spacer 50 protrudes into the semiconductor substrate 20 and divides the active zone 80 into two parts that are conductively isolated from each other by the spacer 50.

In the next step, as shown in FIG. 13E, the openings 52 for fabricating the conductive segments (e.g., 62, 64, and 68 in FIG. 13J) are made above the substrate 20. Then, in the next step, as shown in FIG. 13F, the openings 52 are filled so that the conductive segments (e.g., 62, 64, and 68) cross over the active zone 80 and form conductive contacts with the active regions in the active zone 80.

In the next step, as shown in FIG. 13G, the top level of the conductive segments (e.g., 62, 64, and 68) are recessed, and the recessed conductive segments (e.g., 62, 64, and 68) are covered with the insulation material SAC2 for making self-aligned contacts. Then, a layer of inter-layer dielectric (e.g., ILD1) is deposited and flattened with CMP ("Chemical Mechanical Planarization") or similar process.

In the next step, as shown in FIG. 13H, after parts of ILD1 and SAC2 are selectively removed, openings 53 at the location for making the vias VD are fabricated. Then, in the next step, as shown in FIG. 13I, the openings 53 are filled with conductive materials to form the vias VD for connecting to the conductive segments 62 and 64. Next, as shown in FIG. 13J, conductive routing lines are fabricated in the metal layer M0 that overlies the inter-layer dielectric layer (e.g., ILD1), and some of these conductive routing lines (24 and 26) are conductively connected to the conductive segments (e.g., 62 and 64) through the vias VD.

Figure 14:
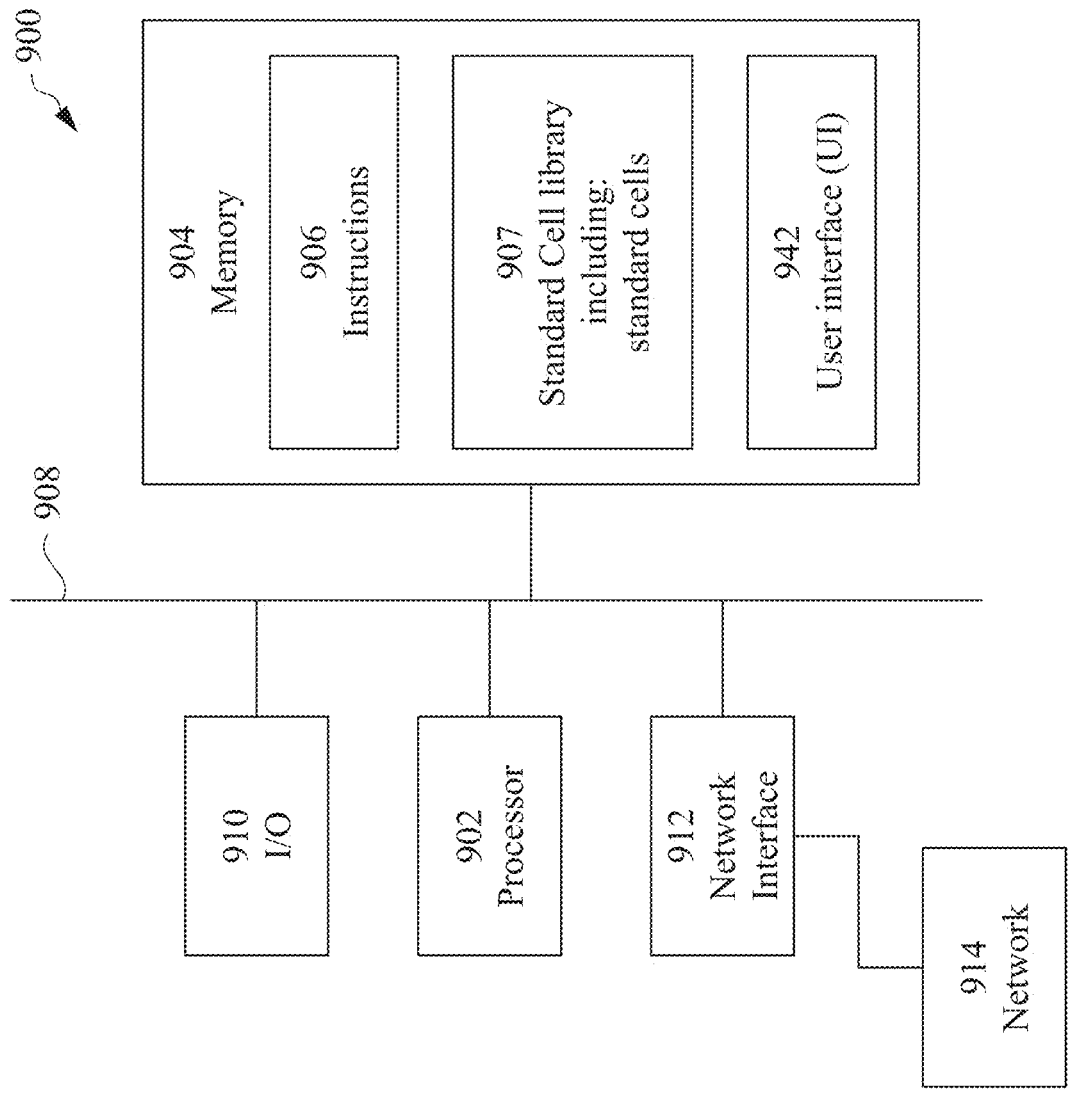
FIG. 14 is a block diagram of an electronic design automation (EDA) system in accordance with some embodiments.

FIG. 14 is a block diagram of an electronic design automation (EDA) system 900 in accordance with some embodiments.

In some embodiments, EDA system 900 includes an APR system. Methods described herein of designing layout diagrams represent wire routing arrangements, in accordance with one or more embodiments, are implementable, for example, using EDA system 900, in accordance with some embodiments.

In some embodiments, EDA system 900 is a general purpose computing device including a hardware processor 902 and a non-transitory, computer-readable storage medium 904. Storage medium 904, amongst other things, is encoded with, i.e., stores, computer program code 906, i.e., a set of executable instructions. Execution of instructions 906 by hardware processor 902 represents (at least in part) an EDA tool which implements a portion or all of, e.g., the methods described herein in accordance with one or more embodiments (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores library 907 of standard cells including such standard cells as disclosed herein.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902.

Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

System 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a UI through I/O interface 910. The information is stored in computer-readable medium 904 as user interface (UI) 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 15:
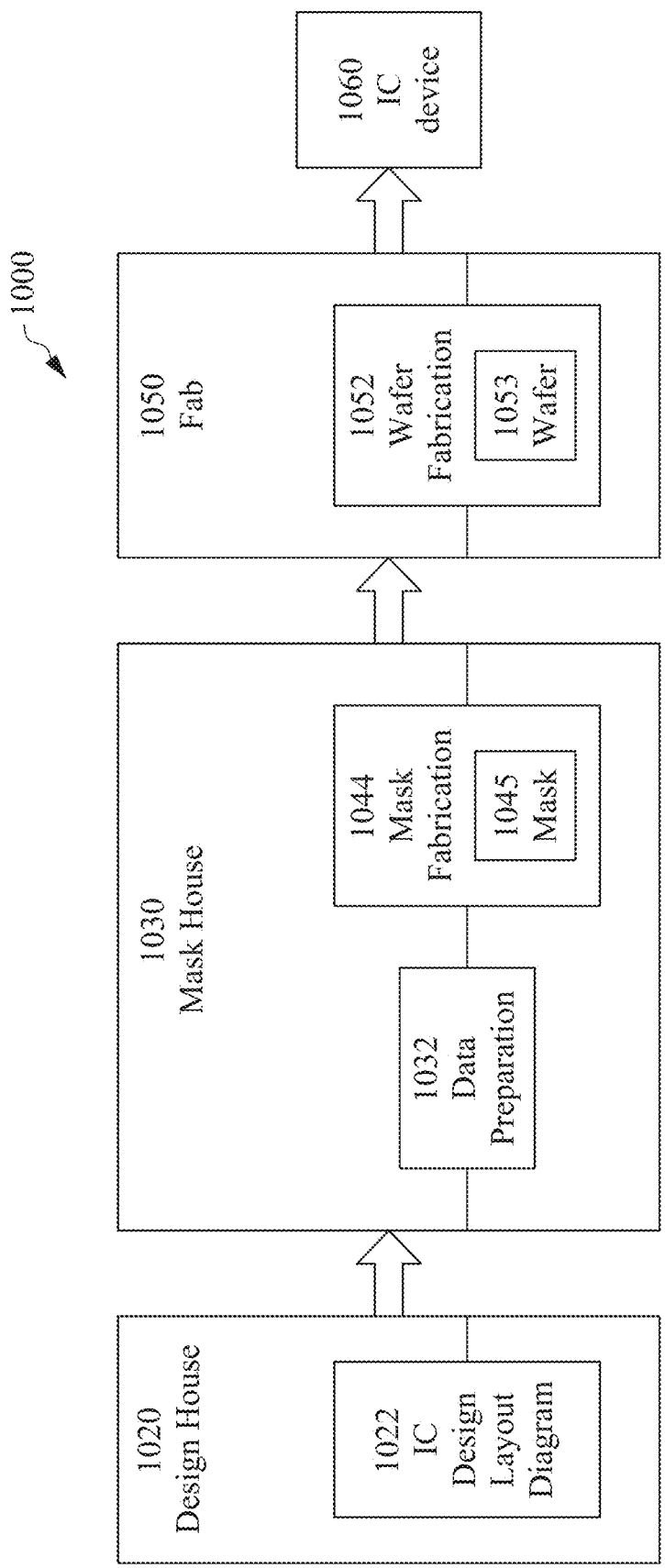
FIG. 15 is a block diagram of an integrated circuit (IC) manufacturing system, and an IC manufacturing flow associated therewith, in accordance with some embodiments.

FIG. 15 is a block diagram of an integrated circuit (IC) manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1000.

In FIG. 15, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place and route. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 15, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 includes wafer fabrication 1052. IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multilevel interconnects, and the like (formed at subsequent manufacturing steps).

Details regarding an integrated circuit (IC) manufacturing system (e.g., system 1000 of FIG. 15), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

One aspect of this description relates to an integrated circuit. The integrated circuit includes a semiconductor substrate, an active zone extending in a first direction, a spacer extending in a second direction perpendicular to the first direction. The spacer divides the active zone into a first part and a second part along the spacer protruding into the semiconductor substrate, with the first part and the second part being conductively isolated from each other by the spacer. The integrated circuit includes a first transistor in the first part of the active zone, a second transistor in the second part of the active zone, and a first gate-strip and a second gate-strip each extending in the second direction. The first transistor has two active regions separated by a channel region. The second transistor has two active regions separated by a channel region. The first gate-strip crosses over the channel region of the first transistor and the second gate-strip crosses over the channel region of the second transistor. The integrated circuit includes a first conductive segment and a second conductive segment each extending in the second direction and in a middle layer. The middle layer is a layer between the semiconductor substrate and a metal layer. The metal layer overlays an inter layer dielectric layer on the semiconductor substrate. The first conductive segment crosses over and forms conductive contact with a first one of the two active regions in the first transistor, and the second conductive segment crosses over and forms conductive contact with a first one of the two active regions in the second transistor. In the integrated circuit, the spacer joins the first conductive segment and the second conductive segment while electrically isolating the first conductive segment from the second conductive segment.

Another aspect of this description relates to an integrated circuit. The integrated circuit includes a semiconductor substrate, a p-type active zone and an n-type active zone forming two parallel active zones each extending in a first direction, and a spacer extending in a second direction perpendicular to the first direction. The spacer divides each of the two parallel active zones into a first part and a second part. The spacer protrudes into the semiconductor substrate and conductively isolates the first part from the second part in each of the two parallel active zones, with the first part at a first side of the spacer and the second part at a second side of the spacer. The integrated circuit includes a first gate-strip extending in the second direction, a second gate-strip extending in the second direction, a first conductive segment extending in the second direction, and a second conductive segment extending in the second direction. The first gate-strip crosses over at least one of the two parallel active zones at the first side of the spacer. The second gate-strip crosses over at least one of the two parallel active zones at the second side of the spacer. The first conductive segment crosses over and forming active region contact with at least one of the two parallel active zones at the first side of the spacer. The second conductive segment crosses over and forming active region contact with at least one of the two parallel active zones at the second side of the spacer. In the integrated circuit, the spacer joins the first conductive segment and the second conductive segment while electrically isolating the first conductive segment from the second conductive segment, each of the first conductive segment and second conductive segment in a middle layer between the semiconductor substrate and a metal layer, with the metal layer overlying an inter layer dielectric layer on the semiconductor substrate.

Still another aspect of this description relates to a method of generating, by a processor, a layout design of an integrated circuit. The method includes creating an active zone pattern, extending in a first direction, that specifies an active zone in a semiconductor substrate. The method includes creating two middle layer patterns, extending in the second direction perpendicular to the first direction, and crossing over the active zone pattern. The two middle layer patterns specify two conductive segments in a middle layer. The middle layer is a layer between the semiconductor substrate and a metal layer, with the metal layer overlying an inter layer dielectric layer on the semiconductor substrate. The method includes creating a spacer pattern, extending in the second direction, jointing the two middle layer patterns, and dividing the active zone pattern into a first part and a second part. In the method, the spacer pattern specifies a spacer that conductively isolates the two conductive segments from each other in the middle layer and conductively isolates the first part of the active zone from the second part of the active zone in the semiconductor substrate.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit comprising:
a semiconductor substrate;
an active zone extending in a first direction;
a spacer of insulating materials extending in a second direction perpendicular to the first direction, the spacer dividing the active zone into a first part and a second part along the spacer protruding into the semiconductor substrate, with the first part and the second part being conductively isolated from each other by the spacer;
a first transistor, in the first part of the active zone, having two active regions separated by a channel region;
a second transistor, in the second part of the active zone, having two active regions separated by a channel region;
a first gate-strip and a second gate-strip each extending in the second direction, wherein the first gate-strip covers the channel region of the first transistor and the second gate-strip covers the channel region of the second transistor;
a first conductive segment and a second conductive segment each extending in the second direction and in a middle layer, wherein the middle layer is a layer between the semiconductor substrate and a metal layer, the metal layer overlying an inter layer dielectric layer on the semiconductor substrate;
wherein the first conductive segment forms conductive contact with a first one of the two active regions in the first transistor, and the second conductive segment forms conductive contact with a first one of the two active regions in the second transistor; and
wherein the spacer joins the first conductive segment and the second conductive segment while electrically isolating the first conductive segment from the second conductive segment.

2. The integrated circuit of claim 1, further comprising:
a first cell having at least one logic function;
a second cell having at least one logic function; and
wherein the first transistor is inside the first cell and the second transistor is located inside the second cell.

3. The integrated circuit of claim 2, wherein the spacer is located at a boundary separating the first cell from the second cell.

4. The integrated circuit of claim 1, further comprising:
a third conductive segment and a fourth conductive segment each extending in the second direction, wherein the third conductive segment covers a second one of the two active regions in the first transistor and the fourth conductive segment covers a second one of the two active regions in the second transistor.

5. The integrated circuit of claim 4, further comprising:
a third gate-strip, extending in the second direction, over the first part of the active zone; and
wherein the third conductive segment is between the third gate-strip and the first gate-strip.

6. The integrated circuit of claim 5, wherein the separation between a middle line of the first gate-strip and a middle line of the second gate-strip is 1.5 times the separation between the middle line of the first gate-strip and a middle line of the third gate-strip.

7. An integrated circuit comprising:
a semiconductor substrate;
a p-type active zone and an n-type active zone forming two parallel active zones each extending in a first direction;
a spacer of insulating materials extending in a second direction perpendicular to the first direction, the spacer dividing each of the two parallel active zones into a first part and a second part, the spacer protrudes into the semiconductor substrate and conductively isolates the first part from the second part in each of the two parallel active zones, with the first part at a first side of the spacer and the second part at a second side of the spacer;
a first gate-strip, extending in the second direction, over at least one of the two parallel active zones at the first side of the spacer;
a second gate-strip, extending in the second direction, over at least one of the two parallel active zones at the second side of the spacer;
a first conductive segment, extending in the second direction, forming active region contact with at least one of the two parallel active zones at the first side of the spacer;

a second conductive segment, extending in the second direction, forming active region contact with at least one of the two parallel active zones at the second side of the spacer; and wherein the spacer joins the first conductive segment and the second conductive segment while electrically isolating the first conductive segment from the second conductive segment, each of the first conductive segment and second conductive segment in a middle layer between the semiconductor substrate and a metal layer, with the metal layer overlying an inter layer dielectric layer on the semiconductor substrate.

8. The integrated circuit of claim 7, wherein each of the first gate-strip and the second gate-strip covers both of the two parallel active zones.

9. The integrated circuit of claim 7, wherein each of the first conductive segment and the second conductive segment covers both of the two parallel active zones.

10. The integrated circuit of claim 7, further comprising:
a first cell having at least one logic function;
a second cell having at least one logic function; and
wherein the first conductive segment and the first gate-strip are inside the first cell, and the second conductive segment and the second gate-strip are inside the second cell.

11. The integrated circuit of claim 10, wherein the spacer is at a boundary separating the first cell from the second cell.

12. The integrated circuit of claim 7, comprising:
a third conductive segment extending in the second direction, the third conductive segment aligned with the first conductive segment along the second direction at the first side of the spacer; and
wherein the first conductive segment covers one of the two parallel active zones at the first side of the spacer, the third conductive segment covers the other one of the two parallel active zones at the first side of the spacer, and the second conductive segment covers both of the two parallel active zones at the second side of the spacer.

13. The integrated circuit of claim 12, wherein the spacer joins the third conductive segment and the second conductive segment while electrically isolating the third conductive segment from the second conductive segment.

14. The integrated circuit of claim 7, further comprising:
a third conductive segment extending in the second direction, the third conductive segment aligned with the first conductive segment along the second direction at the first side of the spacer;
a fourth conductive segment extending in the second direction, the fourth conductive segment aligned with the second conductive segment along the second direction at the second side of the spacer; and
wherein the first conductive segment covers one of the two parallel active zones at the first side of the spacer, the third conductive segment covers the other one of the two parallel active zones at the first side of the spacer, the second conductive segment covers one of the two parallel active zones at the second side of the spacer, and the forth conductive segment covers the other one of the two parallel active zones at the second side of the spacer.

15. The integrated circuit of claim 14, wherein the spacer joins the third conductive segment and the fourth conductive segment while electrically isolating the third conductive segment from the fourth conductive segment.

16. The integrated circuit of claim 7, further comprising:
a third conductive segment, extending in the second direction, over at least one of the two parallel active zones at the first side of the spacer, wherein the first gate-strip is between the first conductive segment and the third conductive segment; and
a third gate-strip, extending in the second direction, over at least one of the two parallel active zones at the first side of the spacer, wherein the third conductive segment is between the third gate-strip and the first gate-strip.

17. The integrated circuit of claim 7, further comprising:
a third gate-strip, extending in the second direction, over at least one of the two parallel active zones at the first side of the spacer; and
wherein the separation between a middle line of the first gate-strip and a middle line of the second gate-strip is 1.5 times the separation between the middle line of the first gate-strip and a middle line of the third gate-strip.

18. The integrated circuit of claim 7, further comprising:
a third gate-strip, extending in the second direction, over at least one of the two parallel active zones at the first side of the spacer; and
a plurality of routing lines, in the metal layer overlying the inter layer dielectric layer, extending in the second direction, wherein a pitch distance between two neighboring routing lines is 0.5 times a pitch distance between the first gate-strip and the third gate-strip.

19. A method of generating, by a processor, a layout design of an integrated circuit, the method comprising:
creating an active zone pattern, extending in a first direction, that specifies an active zone in a semiconductor substrate;
creating two middle layer patterns, extending in the second direction perpendicular to the first direction, over the active zone pattern, wherein the two middle layer patterns specify two conductive segments in a middle layer, wherein the middle layer is a layer between the semiconductor substrate and a metal layer, with the metal layer overlying an inter layer dielectric layer on the semiconductor substrate;
creating a spacer pattern, extending in the second direction, jointing the two middle layer patterns, and dividing the active zone pattern into a first part and a second part; and
wherein the spacer pattern specifies a spacer of insulating materials that conductively isolates the two conductive segments from each other in the middle layer and conductively isolates the first part of the active zone from the second part of the active zone in the semiconductor substrate.

20. The method of claim 19, further comprising:
creating a first cell pattern that specifies a first cell having at least one logic function, the first cell pattern having therein one of the two middle layer patterns;
creating a second cell pattern that specifies a second cell having at least one logic function, the second cell pattern having therein the other one of the two middle layer patterns;
wherein the spacer pattern is at a boundary between the first cell pattern and the second cell pattern.

* * * * *